United States Patent
Christensen et al.

(10) Patent No.: US 11,580,655 B2
(45) Date of Patent: Feb. 14, 2023

(54) SYSTEMS AND METHODS FOR MANIPULATING VIRTUAL SHAPES IN THREE-DIMENSIONAL SPACE

(71) Applicant: Woven Planet North America, Inc., Los Altos, CA (US)

(72) Inventors: Tanner Cotant Christensen, Redwood City, CA (US); Suneet Rajendra Shah, San Francisco, CA (US); Newton Ko Yue Der, San Mateo, CA (US); Brandon Huang, San Mateo, CA (US); Kim Hoang Nguyen, San Jose, CA (US)

(73) Assignee: WOVEN PLANET NORTH AMERICA, INC., Los Altos, CA (US)

( * ) Notice: Subject to any disclaimer, the term of this patent is extended or adjusted under 35 U.S.C. 154(b) by 320 days.

(21) Appl. No.: 16/912,481

(22) Filed: Jun. 25, 2020

(65) Prior Publication Data
US 2021/0407116 A1   Dec. 30, 2021

(51) Int. Cl.
G06T 7/521       (2017.01)
G06T 7/593       (2017.01)
G06T 7/73        (2017.01)

(52) U.S. Cl.
CPC .............. *G06T 7/521* (2017.01); *G06T 7/593* (2017.01); *G06T 7/73* (2017.01)

(58) Field of Classification Search
CPC .......... G06T 7/521; G06T 7/593; G06T 7/73; G06T 19/20; G06F 30/12
USPC ........................................................ 382/154
See application file for complete search history.

(56) References Cited

U.S. PATENT DOCUMENTS

2021/0110557 A1* 4/2021 Busey ....................... G06N 3/08
2021/0134069 A1* 5/2021 Sorrento ................. G06F 3/017

* cited by examiner

*Primary Examiner* — Ayodeji O Ayotunde
(74) *Attorney, Agent, or Firm* — Christopher G. Darrow; Darrow Mustafa PC

(57) ABSTRACT

Examples disclosed herein may involve a computing system that is operable to (i) present, via a visual interface, a virtual shape associated with a three-dimensional (3D) coordinate system, (ii) present, via the visual interface, a visual indicator positioned in proximity to the virtual shape and indicating that a specified spatial parameter of the virtual shape will be modified along a specified dimension of the 3D coordinate system in response to a given type of user input associated with the visual indicator, (iii) while presenting the visual indicator, detect an instance of the given type of user input associated with the visual indicator, and (iv) after detecting the instance of the given type of user input, update the virtual shape that is presented via the visual interface by modifying the specified spatial parameter of the virtual shape along the specified dimension.

18 Claims, 13 Drawing Sheets

SYSTEMS AND METHODS FOR MANIPULATING VIRTUAL SHAPES IN THREE-DIMENSIONAL SPACE

BACKGROUND

Tools for creating and manipulating virtual shapes are increasingly being used in various technological fields. In one example, as part of the development of technology that enables vehicles to operate with some level of autonomous capability, tools for creating and manipulating virtual shapes may be used to create and/or manipulate virtual labels (e.g., bounding boxes) that are applied to objects appearing in sensor data that is representative of a real-world environment, and this labeled sensor data may then be used to create machine learning models and/or maps that are employed by AVs. In yet another example, as part of the development of manufacturing processes, tools for creating and manipulating virtual shapes may be used to create toolpaths that drive machine tools to manufacture physical parts. In another example, as part of the creation of architectural designs, tools for creating and manipulating virtual shapes may be used to create and/or manipulate high definition three-dimensional (3D) models, and these 3D models may then be used to create physical models and/or construction plans.

SUMMARY

In one aspect, disclosed herein is a method that involves (i) presenting, via a visual interface, a virtual shape associated with a three-dimensional (3D) coordinate system, (ii) presenting, via the visual interface, a visual indicator positioned in proximity to the virtual shape and indicating that a specified spatial parameter of the virtual shape will be modified along a specified dimension of the 3D coordinate system in response to a given type of user input associated with the visual indicator, (iii) while presenting the visual indicator, detecting an instance of the given type of user input associated with the visual indicator, and (iv) after detecting the instance of the given type of user input, updating the virtual shape that is presented via the visual interface by modifying the specified spatial parameter of the virtual shape along the specified dimension.

In example embodiments, the method may additionally involve before presenting the visual indicator, detecting a user selection of the specified spatial parameter and the specified dimension of the 3D coordinate system, wherein the detecting of the user selection responsively triggers the presenting of the visual indicator.

Further, in example embodiments, the visual indicator may comprise a first visual indicator indicating that the specified spatial parameter of the virtual shape will be incremented along the specified dimension of the 3D coordinate system in response to receiving a first type of user input associated with the first visual indicator, and the method may additionally involve presenting, via the visual interface, a second visual indicator positioned in proximity to the virtual shape and indicating that the specified spatial parameter of the virtual shape will be decremented along the specified dimension of the 3D coordinate system in response to a second type of user input associated with the second visual indicator.

In these example embodiments, the method may further involve (i) after detecting the instance of the first type of user input and updating the virtual shape that is presented via the visual interface by incrementing the specified spatial parameter of the virtual shape along the specified dimension, detecting an instance of the second type of user input associated with the second visual indicator, and (ii) after detecting the instance of the second type of user input, updating the virtual shape that is presented via the visual interface by decrementing the specified spatial parameter of the virtual shape along the specified dimension.

Further, in these example embodiments, the first visual indicator indicates a first direction along the specified dimension in which the specified spatial parameter of the virtual shape will be incremented in response to the first type of user input, and the second visual indicator indicates a second direction along the specified dimension in which the specified spatial parameter of the virtual shape will be decremented in response to the second type of user input.

Further yet, in example embodiments, the specified spatial parameter and the manner in which the specified spatial parameter is modified may take various forms. For instance, as one possibility, the specified spatial parameter may comprise a size parameter, and modifying the specified spatial parameter of the virtual shape may comprise one of (i) incrementing or decrementing a width of the virtual shape if the specified dimension comprises an x-axis of the 3D coordinate system, (ii) incrementing or decrementing a height of the virtual shape if the specified dimension comprises a y-axis of the 3D coordinate system, or (iii) incrementing or decrementing a depth of the virtual shape if the specified dimension comprises a z-axis of the 3D coordinate system.

As another possibility, the specified spatial parameter may comprise a position parameter, and modifying the specified spatial parameter of the virtual shape may comprise one of (i) incrementing or decrementing a position of the virtual shape along an x-axis of the 3D coordinate system if the specified dimension comprises the x-axis of the 3D coordinate system, (ii) incrementing or decrementing the position of the virtual shape along a y-axis of the 3D coordinate system if the specified dimension comprises the y-axis of the 3D coordinate system, or (iii) incrementing or decrementing the position of the virtual shape along a z-axis of the 3D coordinate system if the specified dimension comprises the z-axis of the 3D coordinate system.

As yet another possibility, the specified spatial parameter may comprise an orientation parameter, and modifying the specified spatial parameter of the virtual shape may comprise one of (i) incrementing or decrementing a pitch of the virtual shape if the specified dimension comprises an x-axis of the 3D coordinate system, (ii) incrementing or decrementing a yaw of the virtual shape if the specified dimension comprises a y-axis of the 3D coordinate system, or (iii) incrementing or decrementing a roll of the virtual shape if the specified dimension comprises a z-axis of the 3D coordinate system.

The specified spatial parameter and the manner in which the specified spatial parameter is modified may take other forms as well.

In example embodiments, the virtual shape may comprise a label of an object detected within sensor data that is representative of a real-world environment, where the sensor data may comprise one or more of Light Detecting and Ranging (LiDAR) data, image data, or telematics data.

Further, in example embodiments, presenting the virtual shape may comprise presenting, via the visual interface, a visualization of the sensor data that includes the label of the object detected within sensor data.

Further yet, in example embodiments, the method may further involve (i) detecting one or more additional instances of the given type of user input associated with the visual indicator, and (ii) further updating the virtual shape that is presented via the visual interface by further modifying the specified spatial parameter of the virtual shape along the specified dimension.

Still further, in example embodiments, the method may further involve presenting, via the visual interface, a representation of an object associated with the virtual shape, where after updating the virtual shape that is presented via the visual interface by modifying the specified spatial parameter of the virtual shape along the specified dimension, the virtual shape is aligned with the representation of the object.

In another aspect, disclosed herein is a computing system comprising at least one processor, a non-transitory computer-readable medium, and program instructions stored on the non-transitory computer-readable medium that are executable by the at least one processor such that the computing system is configured to carry out the functions of the aforementioned method.

In yet another aspect, disclosed herein is a non-transitory computer-readable medium comprising program instructions stored thereon that are executable to cause a computing system to carry out the functions of the aforementioned method.

It should be appreciated that many other features, applications, embodiments, and variations of the disclosed technology will be apparent from the accompanying drawings and from the following detailed description. Additional and alternative implementations of the structures, systems, non-transitory computer readable media, and methods described herein can be employed without departing from the principles of the disclosed technology.

DETAILED DESCRIPTION

Figure 1:
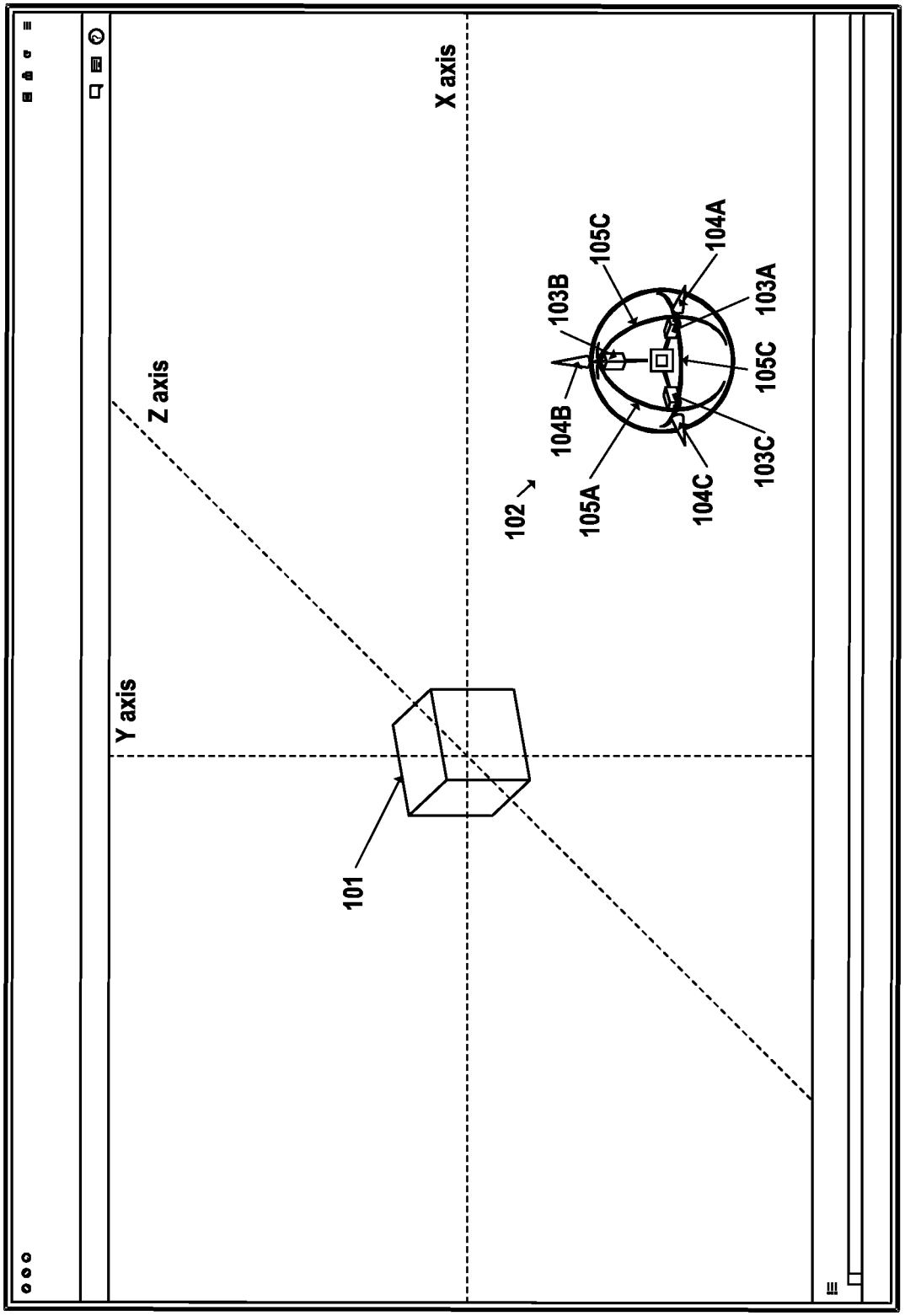
FIG. 1 depicts an example visualization of a virtual shape in a 3D space that can be manipulated using a typical virtual shape manipulation tool.

As noted above, tools for creating and manipulating virtual shapes are increasingly being used in various technological fields. In general, an example tool for creating and manipulating virtual shapes may function to present a visualization of a created virtual shape in a three-dimensional (3D) space, where such a virtual shape may be defined by various types of parameters (such as size, position, and orientation, and the example tool can then be used to manipulate one or more of these types of parameters for the virtual shape. To manipulate the one or more types of parameters, the tool may function to detect various forms of user input (e.g., mouse-based inputs) that are intended to manipulate the virtual shape within the 3D space. In turn, the tool may function to manipulate the virtual shape based on detected user input, which may involve at least one of (i) changing a size of the virtual shape within the 3D space, (ii) changing a position of the virtual shape within the 3D space, and (iii) rotating the virtual shape within the 3D space, among other possibilities. A user may manipulate the virtual shape in the 3D space for various reasons, depending on the application.

One application of a tool for creating and manipulating virtual shapes is for purposes of manually curating sensor data that is representative of a real-world environment in which vehicles may operate, which typically involves a task of applying labels (e.g., two-dimensional (2D) or 3D boxes) to objects that appear within the sensor data and/or adjusting labels that have previously been applied to objects. For instance, a sensor-equipped vehicle may capture sensor data that is representative of a real-world environment, such as light detecting and ranging (LiDAR) data, image data (including video data), and/or telematics data (e.g., Inertial Measurement Unit (IMU) data and/or Global Positioning System (GPS) data), and this sensor data may then be processed and presented to humans for curation. In this respect, such humans (which may be referred to as "curators") are typically tasked with using a tool for creating and manipulating virtual shapes to review the presented sensor data and then manually label certain objects (and/or other features) of interest that appear within such sensor data. These labels are one example of a type of virtual shape that can be manipulated using such a tool.

The labeled sensor data can then be used for various purposes. For instance, as one possibility, labeled sensor data may be used to train machine learning models that are used by an autonomy system of a vehicle to detect objects in the vehicle's surrounding environment. As another possibility, labeled sensor data may be used to build high-resolution maps of real-world environments, which may help improve the accuracy of certain operations performed by autonomy systems of vehicles (e.g., localization, perception, prediction, planning, etc.) as well as certain operations performed by transportation-matching systems (e.g., route generation, time-of-arrival estimates, etc.), among other possible applications.

Based on the foregoing, it will be appreciated that the labels being applied to sensor data generally need to have a high degree of accuracy, as using imprecise labels may (i) negatively affect a vehicle's ability to detect objects in its surrounding environment and/or (ii) cause inaccuracies in the maps of real-world environments that are built using the imprecise labels. Further, it will also be appreciated that a large volume of labeled sensor data is typically needed in order to train accurate machine learning models and/or building accurate high-resolution maps. Because of this, a significant amount of time and cost typically goes into the manual curation of sensor data. For example, in practice, many thousands of frames of sensor data typically need to be labeled before machine learning models can be trained and/or high-resolution maps can be built, and curators are typically required to carefully review and curate each of these frames of sensor data in order to ensure the accuracy for each label being applied to each object that appears within the frame.

However, existing tools for virtual shape manipulation are not tailored for the manipulation of virtual shapes that take the form of 3D labels being applied to sensor data, which tends to increase the time and cost required to label sensor data that is used to train machine learning models and/or build high-resolution maps.

One possible example of an existing tool for virtual shape manipulation is depicted in FIG. 1. In particular, FIG. 1 illustrates a virtual shape manipulation tool 100 that functions to present a visualization of a virtual shape 101 within a 3D space. The virtual shape manipulation tool 100 also functions to present a gizmo 102 that is configured to manipulate the virtual shape 101 in response to certain types of user input.

The gizmo 102 may be a collection of user interface (UI) elements that are configured to receive user input. For instance, as shown, the gizmo 102 is a collection of size manipulators 103A, 103B, and 103C, position manipulators 104A, 104B, and 104C, and orientation manipulators 105A, 105B, and 105C, each of which is configured to accept a mouse input intended to manipulate a respective size, position, or orientation of the virtual shape 101 along a particular dimension. The mouse input may take various forms, including a click-and-drag gesture, among other possibilities.

As one example, the size manipulator 103A may be configured to receive mouse input that when received, causes the size of the virtual shape 101 to increase or decrease along the x-axis, depending on the direction of the mouse input (e.g., increase or decrease the width of the virtual shape 101). As another example, the size manipulator 103B may be configured to receive mouse input that when received, causes the size of the virtual shape 101 to increase or decrease along the y-axis, depending on the direction of the mouse input (e.g., increase or decrease the height of the virtual shape 101). As yet another example, the size manipulator 103C may be configured to receive mouse input that when received, causes the size of the virtual shape 101 to increase or decrease along the z-axis, depending on the direction of the mouse input (e.g., increase or decrease the depth of the virtual shape 101).

Further, the position manipulators 104A, 104B, and 104C, and orientation manipulators 105A, 105B, and 105C may functional similarly to the size manipulators 103A, 103B, and 103C but may be configured to manipulate the position and orientation of the virtual shape 101, respectively.

However, in practice, there are several drawbacks to using the gizmo 102 to manipulate virtual shapes such as 3D labels that are applied to sensor data. For instance, while the gizmo 102 may provide a user with the ability to manipulate the size, position, and orientation of the virtual shape 101 along the x, y, and z axes, the mouse input used to engage with the gizmo 102 is inherently imprecise because small movements of the mouse when interacting with the gizmo 102 may correspond to large manipulations of the virtual shape 101, which in turn makes it very difficult to make fine-grain manipulations of the virtual shape 101 (e.g., manipulations at a pixel level). Further, the gizmo 102 itself is not user intuitive and generally requires a user to learn how each mouse input (e.g., click-and-drag gesture) received by the gizmo 102 will affect the virtual shape 101 before it can be used. This learning process is time consuming in itself, and even though a user may eventually become familiar with the universe of inputs the gizmo 102 can receive and their associated effects, the gizmo 102 still fails to provide any indication to a user of how a particular input via the gizmo 102 will affect the virtual shape 101. As a result, the user may make a manipulation in the wrong direction, which in turn will cause the user to make an additional manipulation to correct the first, erroneous manipulation.

When these existing virtual shape manipulation tools are used to manually label sensor data, each erroneous manipulation may be compounded over thousands of virtual shape manipulations, which in turn substantially increases the time and cost associated with manually curating sensor data. These existing virtual shape manipulation tools may increase the time and cost associated with manipulating virtual shapes when used in other technological applications as well.

Thus, there is a need for a virtual shape manipulation tool that can offer an improved approach to manipulating shapes in which a user can make informed, fine-grain manipulations to a virtual shape.

To address the above issues with existing tools for virtual shape manipulation, disclosed herein is a tool that facilities improved review and manipulation of virtual shapes in a 3D space, such as 3D labels for objects appearing in sensor data that is representative of a real-world environment. The UI elements and functional workflows that are provided by the disclosed tool in order to facilitate review and manipulation of virtual shapes in a 3D space may take any of various forms.

According to one possible implementation, the disclosed tool may initially function to present a 3D visualization of at least one virtual shape, which may be associated with a given 3D coordinate system (e.g., a local coordinate system for the virtual shape) that is used to define the spatial parameters of the virtual shape (e.g., the size, position, and orientation of the virtual shape). In this respect, the virtual shape may comprise a virtual shape that was previously defined using the disclosed tool or a virtual shape that was previously defined by some other software component (e.g., an autolabeling pipeline) and then provided as input to the disclosed tool, among other possibilities. Along with the 3D visualization of the virtual shape, the disclosed tool may also present a user with controls that facilitate manipulation of the virtual shape.

While presenting the 3D visualization of the virtual shape, the disclosed tool may be capable of receiving user selection of a particular spatial parameter of the virtual shape to manipulate (e.g., increment or decrement) along a particular dimension of the 3D coordinate system. The particular spatial parameter may take various forms. As one example, the particular spatial parameter may be a size parameter of the virtual shape that is to be manipulated along either the x-axis of the 3D coordinate system (which may correspond to the width of the virtual shape), the y-axis of the 3D coordinate system (which may correspond to the height of the virtual shape), or the z-axis of the 3D coordinate system (which may correspond to the depth of the virtual shape). As another example, the particular spatial parameter may be a position parameter of the virtual shape that is to be manipulated along either the x-axis of the 3D coordinate system, the y-axis of the 3D coordinate system, or the z-axis of the 3D coordinate system. As yet another example, the particular spatial parameter may include an orientation parameter of the virtual shape that is to be manipulated along either the x-axis of the 3D coordinate system (which may correspond to the pitch of the virtual shape), the y-axis of the 3D coordinate system (which may correspond to the yaw of the virtual shape), or the z-axis of the 3D coordinate system (which may correspond to the roll of the virtual shape). The spatial parameter to be manipulated and the relationship between the spatial parameter and the 3D coordinate system may take other forms as well.

In response to the detecting a user selection of a particular spatial parameter of the virtual shape to manipulate along a particular dimension of the 3D coordinate system, the disclosed tool may then function to present a visual indicator of the particular dimension along which the particular spatial parameter is to be manipulated, which may benefit a user as it allows a user to visualize the particular dimension before a manipulation is made and in turn reduce erroneous manipulations along an unintended dimension. However, it should be understood that in some implementations, the visual indicator of the particular dimension along which the particular spatial parameter is to be manipulated may not be presented in response to detecting a user selection of the particular spatial parameter, may be presented for a limited time, or may be presented for as long as the user is manipulating the particular spatial parameter.

This visual indicator of the particular dimension along which the particular spatial parameter is to be manipulated may be referred to herein as a "dimensional indicator," and may take various forms. As one example, the dimensional indicator presented by the disclosed tool may take the form of a virtual axis that represents the dimensional along which the particular spatial parameter is to be manipulated. The dimensional indicator may take other forms as well.

Additionally, in response to the detecting a user selection of a particular spatial parameter of the virtual shape to manipulate along a particular dimension of the 3D coordinate system, the disclosed tool may also function to present a pair of reciprocal visual indicators that inform the user as to the respective directions that the particular spatial parameter of the virtual shape will be manipulated along the particular dimension in response to different types of user input (i.e., each visual indicator in the pair may correspond to a respective type of user input for manipulating the virtual shape in a respective direction along the particular dimension), which may benefit a user as it allows a user to visualize the directions along the particular dimension that a manipulation can be made and in turn reduce erroneous manipulations in unintended directions along the particular dimension. For instance, the pair of reciprocal visual indicators may comprise (i) a first visual indicator that informs the user of which direction the particular spatial parameter of the virtual shape will be manipulated along the particular dimension in response to a first type of user input (e.g., an increment command that is input via a keyboard or a mouse) and (ii) a second visual indicator that informs the user of which direction the particular spatial parameter of the virtual shape will be manipulated along the particular dimension in response to a second type of user input (e.g., an decrement command that is input via a keyboard or a mouse). These visual indicators inform the user as to the respective directions that the particular spatial parameter of the virtual shape will be manipulated along the particular dimension in response to different types of user input may be referred to herein as "directional indicators," and may take various forms.

For example, if the particular spatial parameter selected for manipulation is a size parameter of the virtual shape, the pair of reciprocal directional indicators may inform the user as to the respective directions that the virtual shape's size will change along the particular dimension in response to different types of user input, such as an expansion of the virtual shape's size along the particular dimension in response to an increment command and a contraction of the virtual shape's size along the particular dimension in response to an decrement command. As another example, if the particular spatial parameter selected for manipulation is a position parameter of the virtual shape, the pair of reciprocal directional indicators may inform the user as to the respective directions that the virtual shape's position will change along the particular dimension in response to different types of user input, such as positional shift in a first direction along the particular dimension in response to an increment command and a positional shift in a second direction that is opposite the first direction and along the particular dimension in response to an decrement command. In yet another example, if the particular spatial parameter selected for manipulation is an orientation parameter of the virtual shape, the pair of reciprocal directional indicators may inform the user as to the respective directions that the virtual shape's orientation will change along the particular dimension in response to different types of user input, such as rotation in a first direction about the particular dimension in response to an increment command and a rotation in a second direction that is opposite the first direction and about the particular dimension in response to an decrement command. Other examples of directional indicators are possible as well.

It should also be understood that, in other implementations, the disclosed tool may function to present only a single directional indicator, as opposed to a pair of reciprocal directional indicators. For instance, in response to the detecting a user selection of a particular spatial parameter of the virtual shape to manipulate along a particular dimension of the 3D coordinate system, the disclosed tool may function to present a single directional indicator to inform the user that the particular spatial parameter of the virtual shape will be manipulated in one specified direction along the particular dimension in response to one specified type of user input (e.g., an increment command), and based on this single directional indicator, the user may then be able to infer that the particular spatial parameter of the virtual shape will be manipulated in the opposite direction along the particular dimension in response to a reciprocal type of user input (e.g., a decrement command).

After presenting the dimensional and directional indicators in this manner, the disclosed tool may then be capable of detecting and processing instances of either (i) the first type of user input that corresponds to manipulation of the particular spatial parameter of the virtual shape in a first direction along the particular dimension or (ii) the second type of user input that corresponds to manipulation of the particular spatial parameter of the virtual shape in a second direction that is opposite the first direction and along the particular dimension. For instance, if the disclosed tool detects an instance of the first type of user input, the disclosed tool may responsively modify the particular spatial parameter of the virtual shape in the direction along the particular dimension that corresponds to the first type of user input—which may involve updating both the data defining the virtual shape and the visualization of the virtual shape to reflect this modification. On the other hand, if the disclosed tool detects an instance of the second type of user input, the disclosed tool may responsively modify the particular spatial parameter of the virtual shape in the direction along the particular dimension that corresponds to the second type of user input—which may involve updating both the data defining the virtual shape and the visualization of the virtual shape to reflect this modification.

The disclosed tool may include various other features and take various other forms as well.

One illustrative example of the disclosed tool for reviewing and manipulating virtual shapes will now be described with reference to FIGS. 2A-2J.

Figure 2A:
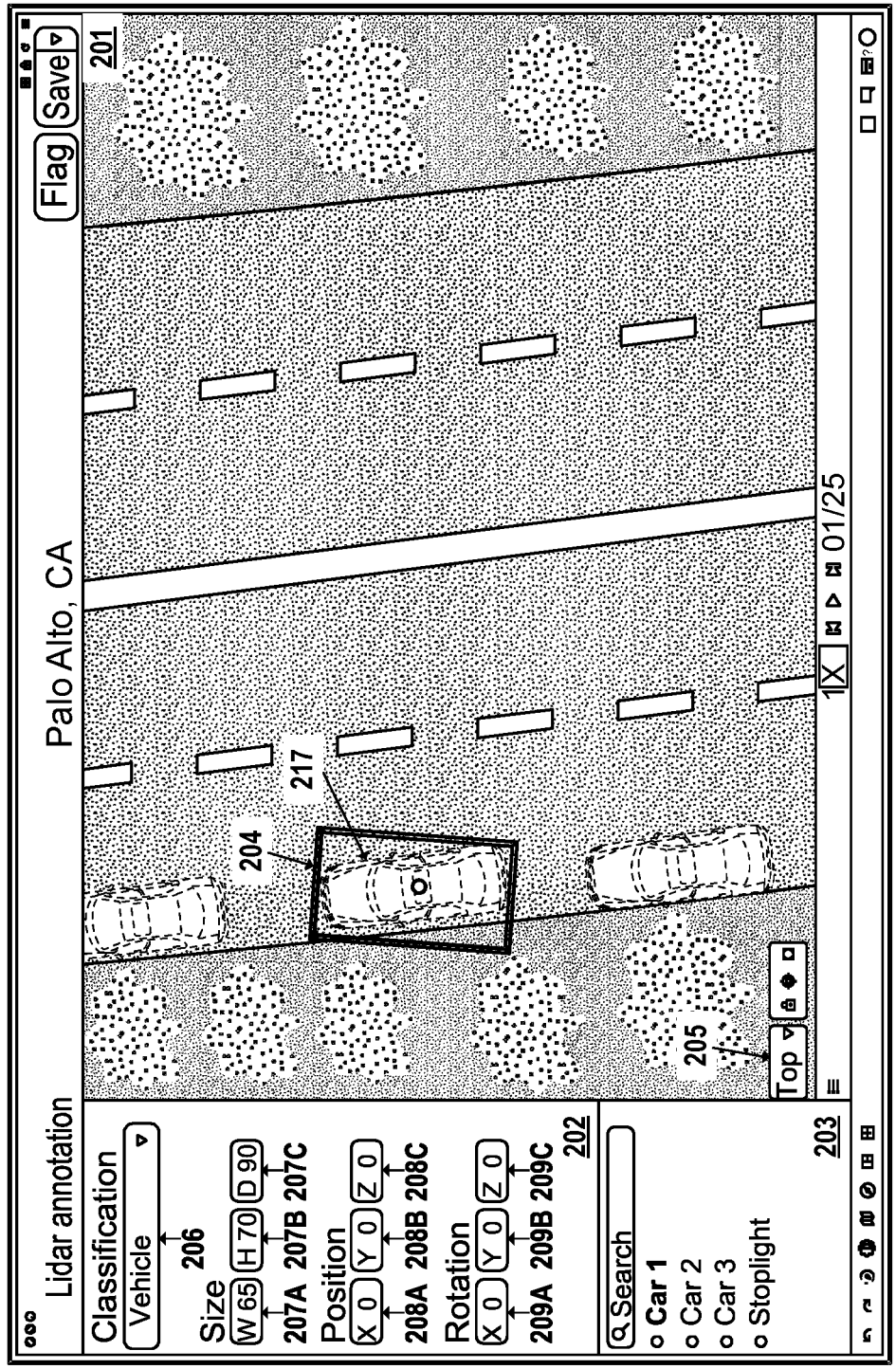
FIG. 2A depicts an example visualization of a top-down view of a virtual shape in a 3D space that is capable of being manipulated using the disclosed tool for manipulating the virtual shape in accordance with the present disclosure.

Beginning with FIG. 2A, an example virtual shape manipulation tool 200 is shown, which includes a visualization pane 201, a manipulation pane 202, and a selection pane 203. Each of the visualization pane 201, the manipulation pane 202, and the selection pane 203 may be displayed to a user via a visual interface that assists the user in manipulating various virtual shapes, of which virtual shape 204 is an example.

The visualization pane 201 may generally function to present one or more views of virtual shapes within a 3D space. In this respect, the visualization pane 201 may be configurable to define either one view, or a plurality of views of the virtual shapes. The views may take various forms, including a top-down view, a front view, a side view, and/or a custom view that is definable by the user, among other possibilities. The views may take other forms as well.

For example, as shown in FIG. 2A, visualization pane 201 depicts a top-down visualization of a virtual shape 204 in a 3D space that provides a virtual representation of sensor data. Further, the virtual representation of the sensor data may include a set of sensor data points that is representative of one or more objects, such as vehicle 217. In this respect, the vehicle 217 may be a subset of the sensor data points that is included in the virtual representation. It should be understood that the objects that appear within the sensor data are illustrated as having distinct borders for the purposes of illustration only, and that in practice, the objects may actually appear as a dense set of points within the sensor data.

As shown, the virtual shape 204 is a polyhedron that is associated with the vehicle 217 within the 3D space. While the visualization pane 201 only depicts a top-down visualization of the virtual shape 204, the visualization pane 201 may depict various other predetermined visualizations, such as (i) a front visualization that is oriented at the front of the virtual shape 204, (ii) a side visualization that is oriented at the side of the virtual shape 204, and (iii) a dashcam visualization that is oriented to a point-of-view (POV) of the collection vehicle that captured the sensor data that defines the 3D space. In addition to the various predetermined visualizations, visualization pane 201 may also include a custom visualization that is user-definable to visualize the virtual shape 204 from any desired angle.

In operation, a user can define a particular visualization in the visualization pane 201 by selecting a visualization from the visualization selector 205. The visualization selector 205 may be implemented as a selectable UI element, which may take various forms. As shown in FIG. 2A, the visualization selector 205 takes the form of a drop-down menu, but the visualization selector 205 may take various forms as well, including but not limited to a checkbox, textbox, and/or button.

Further, the user may select a visualization via visualization selector 205 through a variety of user inputs, which may depend on the form of the visualization selector 205. For example, as shown in FIG. 2A, the visualization selector 205 is a drop-down menu and the user may select a visualization through either (i) clicking, via a mouse, on the drop-down menu and then subsequently clicking on the visualization, (ii) navigating to the visualization selector 205 through pressing a keyboard-based command configured to navigate the visualization pane 201 (e.g., the "TAB" key) and then using another keyboard-based command to select the visualization (e.g., the arrow keys), or (iii) pressing, via a touchscreen, on the drop-down menu and then subsequently pressing on the visualization. A user may interact with the visualization selector 205 in various other ways as well.

The manipulation pane 202 generally functions to facilitate manipulation of various types of spatial parameters of the virtual shapes displayed in the visualization pane 201 through a plurality of UI elements, where each UI element corresponds to a respective dimension along which a respective spatial parameter of the virtual shapes can be manipulated. In this respect, manipulation pane 202 may present a separate UI element that facilitates manipulation of each of a virtual shape's (i) size along the x-axis (e.g., width), y-axis (e.g., height), and z-axis (e.g., depth), (ii) position along the x-axis, y-axis, and z-axis, and (iii) orientation about the x-axis (e.g., pitch), y-axis (e.g., yaw), and z-axis (e.g., roll).

Further, in certain implementations, manipulation pane 202 may also include one or more UI elements that are configured to assign a classification to the virtual shape that is being manipulated. This may be beneficial in circumstances in which the virtual shapes are associated with different types of objects as it allows a user to classify the virtual shape as being associated with a particular type of object.

For example, as shown in FIG. 2A, the manipulation pane 202 depicts a classification manipulator 206, size manipulators 207A, 207B, and 207C, position manipulators 208A, 208B, 208C, and orientation manipulators 209A, 209B, and 209C, all of which are configured to facilitate the manipulation of virtual shape 204.

The classification manipulator 206 may be a selectable UI element that allows a user to assign a classification to the virtual shape 204. The classification manipulator 206 may take various forms. For example, and as shown in FIG. 2A, the classification manipulator 206 may take the form of a drop-down menu that allows a user to assign a classification to the virtual shape 204. The classification manipulator 206 may take various forms as well, including but not limited to a checkbox, textbox, and/or button. Further, the assigned classification may correspond to the type of object in the captured sensor data to which the virtual shape 204 corresponds. For instance, as shown, the virtual shape 204 corresponds to the vehicle 217, which may be a subset of captured sensor data that is representative of a car.

In operation, a user can assign a classification to the virtual shape 204 by selecting a classification from the classification manipulator 206. The user may select the classification through a variety of user inputs, which may depend on the form of the classification manipulator 206. For example, as shown in FIG. 2A, the classification manipulator 206 is a drop-down menu and thus the user may select the classification through either (i) clicking, via a mouse, on the drop-down menu and then subsequently clicking on the classification, (ii) navigating to the classification manipulator 206 through pressing a keyboard-based command configured to navigate the manipulation pane 202 (e.g., the "TAB" key) and then using another keyboard-based command to select the classification (e.g., the arrow keys), or (iii) pressing, via a touchscreen, on the drop-down menu and then subsequently pressing on the classification. A user may select the a classification through various other ways as well.

The size manipulators 207A, 207B, and 207C may be a plurality of selectable UI elements, where each UI element corresponds to a respective dimension along which a corresponding size parameter of the virtual shape 204 can be manipulated. As shown, the size manipulator 207A may be a UI element that is configured to manipulate the size of the virtual shape 204 along the x-axis (e.g., the width of the virtual shape 204), the size manipulator 207B may be a UI element that is configured to manipulate the size of the virtual shape 204 along the y-axis (e.g., the height of the virtual shape 204), and the size manipulator 207C may be a UI element that is configured to manipulate the size of the virtual shape 204 along the z-axis (e.g., the depth of the virtual shape 204).

Further, each of the size manipulators 207A, 207B, and 207C may have an associated value that, together, define the size of the virtual shape 204 within the 3D space shown in the visualization pane 201. For instance, as shown, the size manipulator 207A has a value of 65, which indicates the size of the virtual shape 204 extends 65 along the x-axis, the size manipulator 207B has a value of 70, which indicates the size of the virtual shape 204 extends 70 along the y-axis, and the size manipulator 207C has a value of 90, which indicates the size of the virtual shape 204 extends 90 along the z-axis. These values may be associated with a unit of measurement (e.g., the unit of measurement employed by the virtual shape's associated coordinate system).

In operation, a user can interact with the size manipulators 207A, 207B, and 207C by (i) selecting one of the size manipulators 207A, 207B, or 207C within the manipulation pane 202, and (ii) entering a type of user input that corresponds to incrementing or decrementing the associated value of the selected one of the size manipulators 207A, 207B, or 207C. The amount the associated value of the selected one of the size manipulators 207A, 207B, or 207C is incremented or decremented in response to the entered type of user input may be a fixed amount that is constant across each instance of the type of user input. For instance, the associated value of the selected one of the size manipulators 207A, 207B, or 207C may be incremented or decremented by the same amount (e.g., 1, 3, 5, etc.) each time the corresponding type of user input is entered.

In this respect, a user may select one of the size manipulators 207A, 207B, or 207C with various forms of user input. For example, the user may either (i) input a keyboard-based command (e.g., the "TAB" key) that is configured to navigate through the manipulator pane 202 until the user reaches one of the size manipulators 207A, 207B, or 207C, (ii) click, via a mouse, on one of the size manipulators 207A, 207B, or 207C within the manipulation pane 202, or (iii) press, via a touchscreen, on one of the size manipulators 207A, 207B, or 207C within the manipulation pane 202. The user input may take various other forms as well.

Once the user has selected one of the size manipulators 207A, 207B, or 207C, the user can increment or decrement the value associated with the selected one of the size manipulators 207A, 207B, or 207C through entering a respective type of user input. The respective type of user input may take various forms. As one example, the respective user input may take the form of a keyboard-based command (e.g., the up-arrow key) that is configured to increment the value associated with the selected one of the size manipulators 207A, 207B, or 207C. As another example, the respective user input may take the form of a different and/or reciprocal keyboard-based command (e.g., the down-arrow key) that is configured to decrement the value associated with the selected one of the size manipulators 207A, 207B, or 207C. The respective user input may take various other forms as well.

The position manipulators 208A, 208B, and 208C may be a plurality of selectable UI elements, where each UI element corresponds to a respective dimension along which a corresponding position parameter of the virtual shape 204 can be manipulated. As shown, the position manipulator 208A may be a UI element that is configured to shift the position of the virtual shape 204 along the x-axis, the position manipulator 208B may be a UI element that is configured to shift the position of the virtual shape 204 along the y-axis, and the position manipulator 208C may be a UI element that is configured to shift the position of the virtual shape 204 along the z-axis.

Further, each of the position manipulators 208A, 208B, and 208C may have an associated value that, together, define the position of the virtual shape 204 with respect to its associated coordinate system. For instance, as shown, each of the position manipulators 208A, 208B, and 208C have a value of 0, which indicates the virtual shape 204 is the centroid of its associated coordinate system. These values may be associated with a unit of measurement (e.g., the unit of measurement employed by the virtual shape's associated coordinate system).

In operation, a user can interact with the position manipulators 208A, 208B, and 208C by (i) selecting one of the position manipulators 208A, 208B, and 208C within the manipulation pane 202, and (ii) entering a type of user input that corresponds to incrementing or decrementing the associated value of the selected one of the position manipulators 208A, 208B, and 208C. The amount the associated value of the selected one of the position manipulators 208A, 208B, and 208C is incremented or decremented in response to the entered type of user input may be a fixed amount that is constant across each instance of the type of user input. For instance, the associated value of the selected one of the position manipulators 208A, 208B, and 208C may be incremented or decremented by the same amount (e.g., 1, 3, 5, etc.) each time the corresponding type of user input is entered.

In this respect, a user may select one of the position manipulators 208A, 208B, and 208C with various forms of user input. For example, the user may either (i) input a keyboard-based command (e.g., the "TAB" key) that is configured to navigate through the manipulator pane 202 until the user reaches one of the position manipulators 208A, 208B, and 208C, (ii) click, via a mouse, on one of the position manipulators 208A, 208B, and 208C within the manipulation pane 202, or (iii) press, via a touchscreen, on one of the position manipulators 208A, 208B, and 208C within the manipulation pane 202. The user input may take various other forms as well.

Once the user has selected one of the position manipulators 208A, 208B, and 208C, the user can increment or decrement the value associated with the selected one of the position manipulators 208A, 208B, and 208C through entering a respective type of user input. The respective type of user input may take various forms. As one example, the respective user input may take the form of a keyboard-based command (e.g., the up-arrow key) that is configured to increment the value associated with the selected one of the position manipulators 208A, 208B, and 208C. As another example, the respective user input may take the form of a different and/or reciprocal keyboard-based command (e.g., the down-arrow key) that is configured to decrement the value associated with the selected one of the position manipulators 208A, 208B, and 208C. The respective user input may take various other forms as well.

The orientation manipulators 209A, 209B, and 209C may be a plurality of selectable UI elements, where each UI element corresponds to a respective dimension about which a corresponding orientation parameter of the virtual shape 204 can be manipulated. As shown, the orientation manipulator 209A may be a UI element that is configured to rotate the virtual shape 204 about the x-axis (e.g., manipulate the pitch of the virtual shape 204), the orientation manipulator 209B may be a UI element that is configured to rotate the virtual shape 204 about the y-axis (e.g., manipulate the yaw of the virtual shape 204), and the orientation manipulator 209C may be a UI element that is configured to rotate the virtual shape 204 about the z-axis (e.g., manipulate the roll of the virtual shape 204).

Further, each of the orientation manipulators 209A, 209B, and 209C may have an associated value that, together, define the orientation of the virtual shape 204 with respect to its associated coordinate system. For instance, as shown, each of the orientation manipulators 209A, 209B, and 209C have a value of 0, which indicates the virtual shape 204 is oriented neutrally within its associated coordinate system. These values may be associated with a unit of measurement (e.g., the unit of measurement employed by the virtual shape's associated coordinate system).

In operation, a user can interact with the orientation manipulators 209A, 209B, and 209C by (i) selecting one of the orientation manipulators 209A, 209B, and 209C within the manipulation pane 202, and (ii) entering a type of user input that corresponds to incrementing or decrementing the associated value of the selected one of the orientation manipulators 209A, 209B, and 209C. The amount the associated value of the selected one of the orientation manipulators 209A, 209B, and 209C is incremented or decremented in response to the entered type of user input may be a fixed amount that is constant across each instance of the type of user input. For instance, the associated value of the selected one of the orientation manipulators 209A, 209B, and 209C may be incremented or decremented by the same amount (e.g., 1, 3, 5, etc.) each time the corresponding type of user input is entered.

In this respect, a user may select one of the orientation manipulators 209A, 209B, and 209C with various forms of user input. For example, the user may either (i) input a keyboard-based command (e.g., the "TAB" key) that is configured to navigate through the manipulator pane 202 until the user reaches one of the orientation manipulators 209A, 209B, and 209C, (ii) click, via a mouse, on one of the orientation manipulators 209A, 209B, and 209C within the manipulation pane 202, or (iii) press, via a touchscreen, on one of the orientation manipulators 209A, 209B, and 209C within the manipulation pane 202. The user input may take various other forms as well.

Once the user has selected one of the orientation manipulators 209A, 209B, and 209C, the user can increment or decrement the value associated with the selected one of the orientation manipulators 209A, 209B, and 209C through entering a respective type of user input. The respective type of user input may take various forms. As one example, the respective user input may take the form of a keyboard-based command (e.g., the up-arrow key) that is configured to increment the value associated with the selected one of the orientation manipulators 209A, 209B, and 209C. As another example, the respective user input may take the form of a different and/or reciprocal keyboard-based command (e.g., the down-arrow key) that is configured to decrement the value associated with the selected one of the orientation manipulators 209A, 209B, and 209C. The respective user input may take various other forms as well.

Referring again to FIG. 2A, the selection pane 203 may be a plurality of selectable UI elements, where each UI element corresponds to a respective virtual shape that can be viewed within the visualization pane 201 and manipulated via the manipulation pane 202. In this respect, the selection of any one of the plurality of selectable UI elements within the selection pane 203 may cause the corresponding virtual shape to be displayed within the visualization pane 201.

Further, the selectable UI elements may take various forms. For example, the UI elements may take the form of a list of user-selectable buttons that, when selected, cause the visualization pane 201 to display a respective virtual shape. The user-selectable graphical elements that represent the virtual shapes may take other forms as well, including but not limited to a textbox or drop-down menu.

For example, as shown, the selection pane 203 is a list of UI elements that correspond to virtual shapes that represent "Car 1," "Car 2," "Car 3," and "Stoplight." Further, as shown by the bolding of "Car 1" in the selection pane 203, the virtual shape 204 displayed within the visualization pane 201 corresponds to the vehicle 217, which has been labeled as "Car 1."

In operation, a user can change the virtual shape being displayed within the visualization pane 201 by selecting the UI element that corresponds to a virtual shape in the selection pane 203. The user may select the UI through various forms of user input. For example, the user may (i) enter a keyboard-based command (e.g., press the right-arrow key) to move to the next virtual shape until the user reaches a virtual shape, (ii) click, via a mouse, on a virtual shape within the selection pane 203, and/or (iii) press, via a touchscreen, the virtual shape within the selection pane 203. The user input may take various other forms as well.

It should be understood that while the keyboard-based commands described above reference particular keys of a keyboard, any key or other button on a peripheral device may be bound and used to interact with the various panes of the virtual shape manipulation tool 200. For instance, while the right-arrow key on the keyboard may be used to switch to the next virtual shape in the selection pane 203, a user may define the "ALT" key to perform the same action. Many other examples exist.

In practice, once the virtual manipulation tool 200 displays a virtual shape to a user, the user may determine that a series of manipulations may be necessary to conform the virtual shape to a given object that appears within the sensor data. In this respect, the user may select the UI element of manipulation pane 202 that corresponds to the spatial parameter the user is to manipulate. In response to the user's selection, the virtual manipulation tool 200 may display, via the visualization pane 201, a dimensional indicator that indicates the particular dimension along which the selected spatial parameter will be manipulated. In this respect, the dimensional indicator may be a virtual axis that may inform the user as to the particular dimension along which the selected spatial parameter will be manipulated.

Further in response to the user's selection, the virtual manipulation tool 200 may display, via the visualization pane 201, a pair of directional indicators that may comprise (i) a first directional indicator that informs the user of which direction the selected spatial parameter of the virtual shape will be manipulated along the particular dimension in response to a first type of user input (e.g., an increment command that is input via a keyboard or a mouse) and (ii) a second directional indicator that informs the user of which direction the particular spatial parameter of the virtual shape will be manipulated along the particular dimension in response to a second type of user input (e.g., an decrement command that is input via a keyboard or a mouse).

Figure 2B:
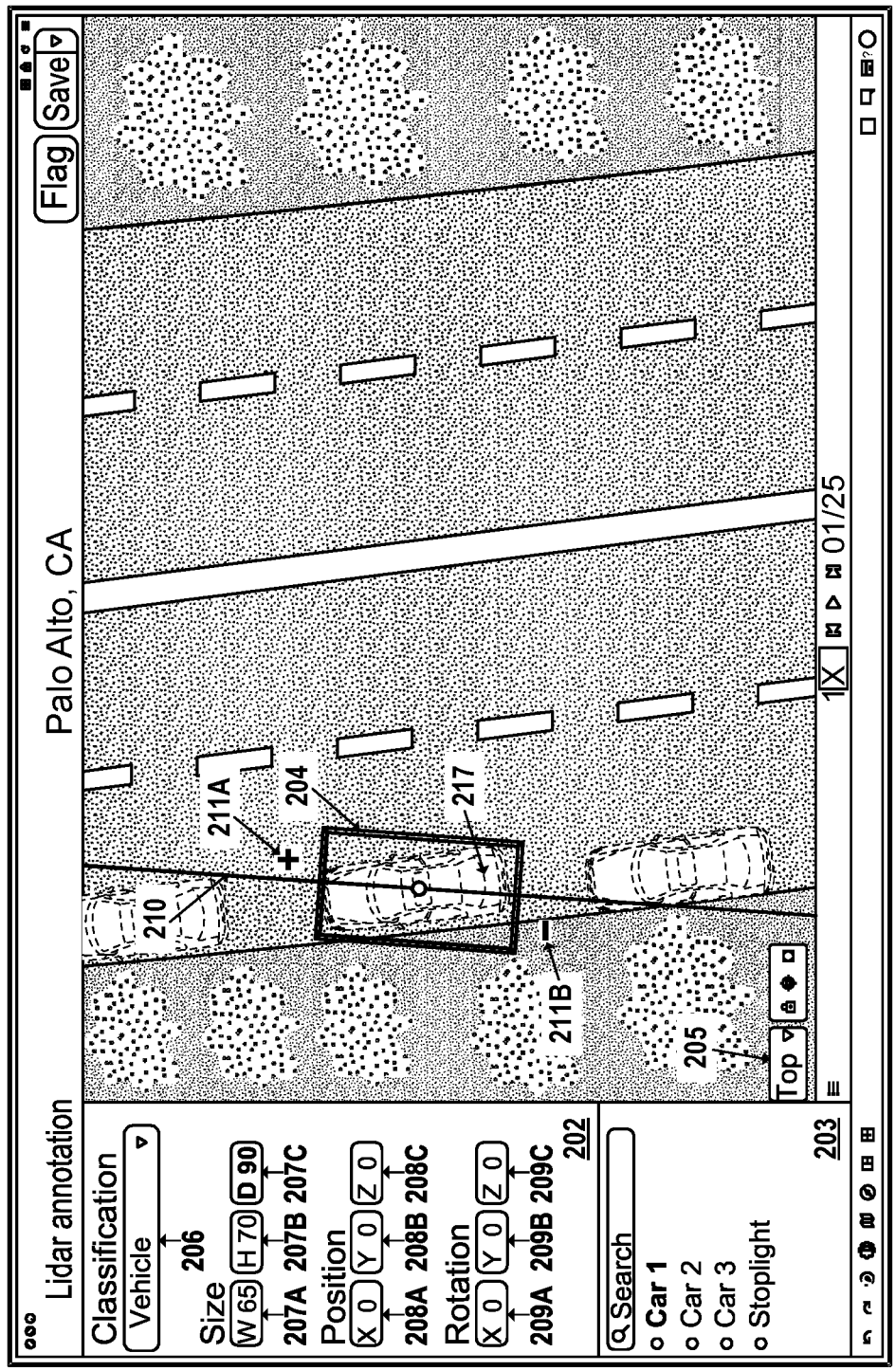
FIG. 2B depicts the example visualization of FIG. 2A with a size parameter of the virtual shape selected for manipulation along the z-axis in accordance with the present disclosure.

For example, as shown in FIG. 2A, the virtual shape 204 does not fully encompass and/or align with the vehicle 217. In response, the user may determine that the size parameter may need to be manipulated along the z-axis (e.g., to manipulate the depth of the virtual shape 204) to conform the virtual shape 204 to the vehicle 217. To accomplish this, the user may first select the size manipulator 207C through the series of user inputs described above. The end result of this selection of the size manipulator 207C is illustrated in FIG. 2B, which shows that the size parameter has been selected for manipulation along the z-axis.

In response to the selection to manipulate the size parameter along the z-axis, dimensional indicator 210 and directional indicators 211A and 211B have been displayed. As shown, dimensional indicator 210 is a virtual z-axis, which indicates to the user that the user is about to make a manipulation to the size of the virtual shape 204 along the z-axis. Also as shown, directional indicator 211A is a "+" sign that indicates to the user that inputting the type of user input that is mapped to the increment command will increase the size of the virtual shape 204 along the z-axis. Further, as shown, directional indicator 211B is a "−" sign that indicates to the user that inputting the type of user input that is mapped to the decrement command will decrease the size of the virtual shape 204 along the z-axis. directional indicator 211A directional indicator 211B In operation, the types of user inputs that are mapped to the increment and decrement commands to which directional indicators 211A and 211B respectively correspond may take various forms. For example, the type of user inputs may be keyboard-based commands (e.g., the up-arrow key may correspond to the directional indicator 211A and the down-arrow key may correspond to the directional indicator 211B). The respective types of user inputs may take various other forms as well. In any event, as shown in FIG. 2B, if a user enters the type of user input that corresponds to directional indicator 211A, the value of the size parameter along the z-axis will increase. The amount that the size parameter is increased may be predetermined depending on the user's preferences. For instance, any increment or decrement action may be predetermined to be as small as one pixel or as large as one unit of measurement. The end result of increasing the size parameter along the z-axis is illustrated in FIG. 2C, which shows that the size parameter of the virtual shape 204 has been increased to 92 along the z-axis and the visualization pane 201 has been updated to reflect the increased size of the virtual shape 204.

In some circumstances, after increasing the size of the virtual shape 204 along the z-axis, the user may determine that the size parameter of virtual shape 204 has been increased too much and that the size of the virtual shape 204 will not only encompass the vehicle 217 but also encompass additional sensor data that is not representative of the vehicle 217. In response, the user may enter the type of user input that corresponds to directional indicator 211B to decrease the value of the size parameter along the z-axis.

Figure 2C:
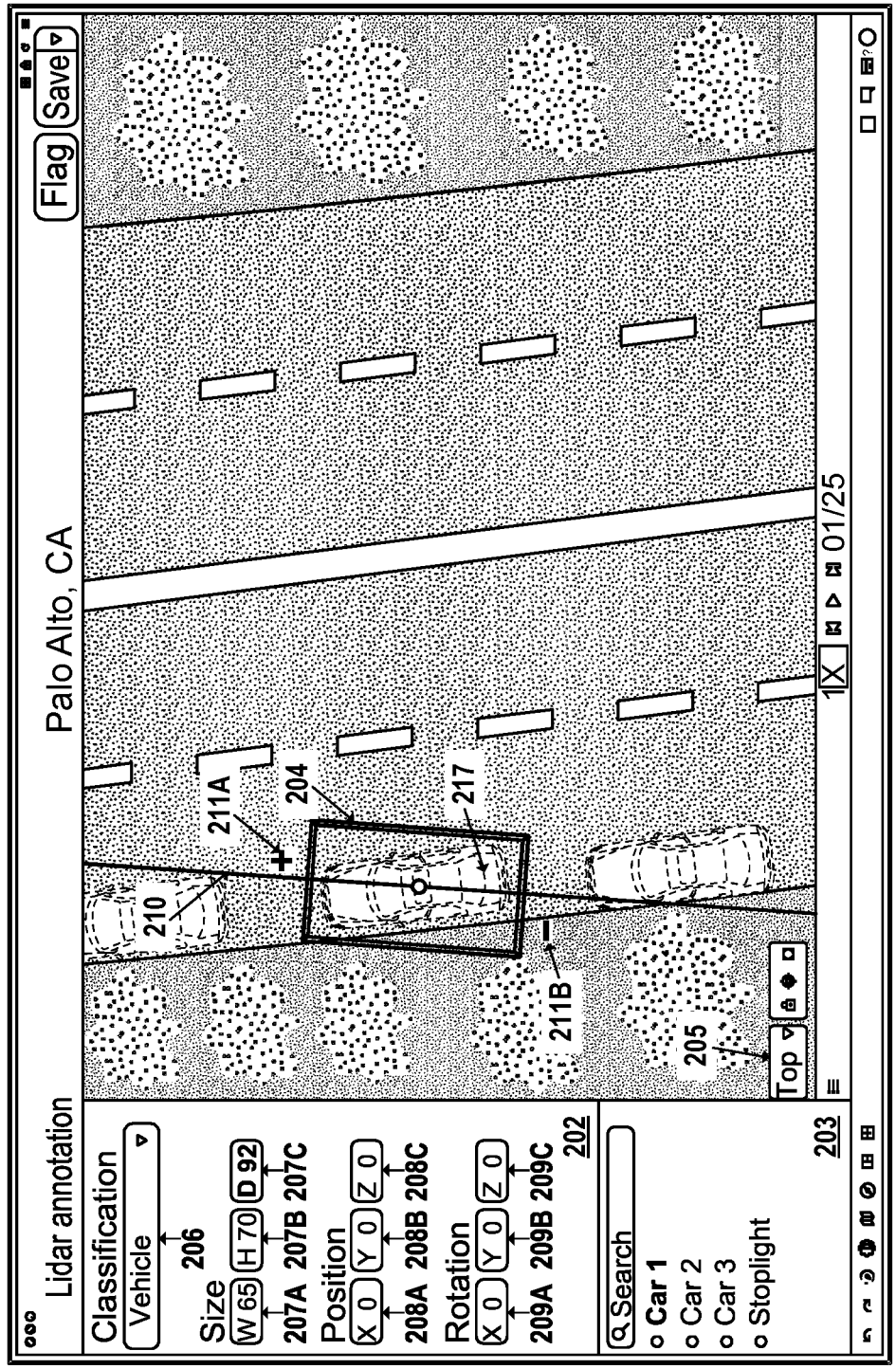
FIG. 2C depicts the example visualization of FIG. 2B with the size parameter of the virtual shape manipulated along the z-axis in accordance with the present disclosure.
Figure 2D:
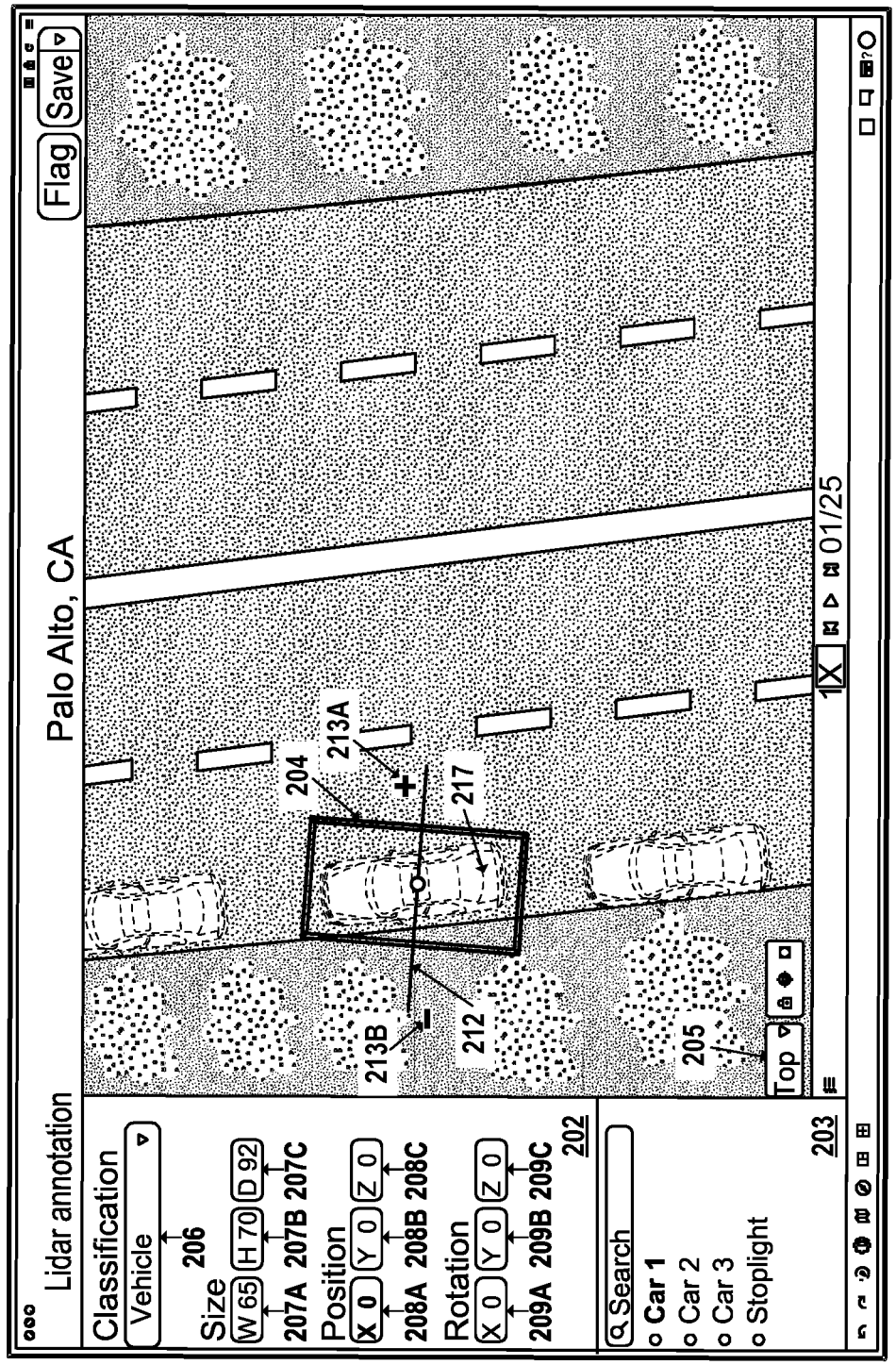
FIG. 2D depicts the example visualization of FIG. 2C with a position parameter of the virtual shape selected for manipulation along the x-axis in accordance with the present disclosure.

However, the user, after increasing the size of the virtual shape 204 along the z-axis, may determine that the size of the virtual shape 204 shown in FIG. 2C is now acceptable, but may still desire to manipulate the position of the virtual shape 204 along the x-axis. To accomplish this, the user may first select the positional manipulator 208A through the series of user inputs described above with respect to FIG. 2A. The end result of this selection of the position manipulator 208A is illustrated in FIG. 2D, which shows that the position parameter of the virtual shape 204 has been selected for manipulation along the x-axis.

In response to the selection the position manipulator 208A to manipulate the position parameter of the virtual shape 204 along the x-axis, the virtual shape manipulation tool 200 may display, via visualization pane 201, dimensional indicator 212 and directional indicators 213A and 213B. The directional indicator 212 may function similarly to dimensional indicator 210 described above with respect to FIGS. 2B and 2C but may be updated to inform the user that the user is about to make a manipulation to the position of the virtual shape along the x-axis. In this respect, as shown in FIG. 2D, the dimensional indicator 212 is a virtual x-axis.

Further in response to the selection to manipulate the position parameter of the virtual shape 204 along the x-axis, the virtual shape manipulation tool 200 may display, via visualization 201, directional indicators 213A and 213B. The directional indicators 213A and 213B may function similarly to directional indicators 211A and 211B described above with respect to FIGS. 2B and 2C but may be updated to inform the user as to the respective directions along the x-axis the virtual shape 204 will be manipulated in response to respective types of user input. In this respect, as shown in FIG. 2D, the directional indicator 213A is a "+" that indicates that inputting the type of user input that is mapped to the increment command will shift the virtual shape 204 positively along the x-axis. Further, as shown, directional indicator 213B is a "−" sign that indicates to the user that inputting the type of user input that is mapped to the decrement command will shift the virtual shape 204 negatively along the x-axis.

Figure 2E:
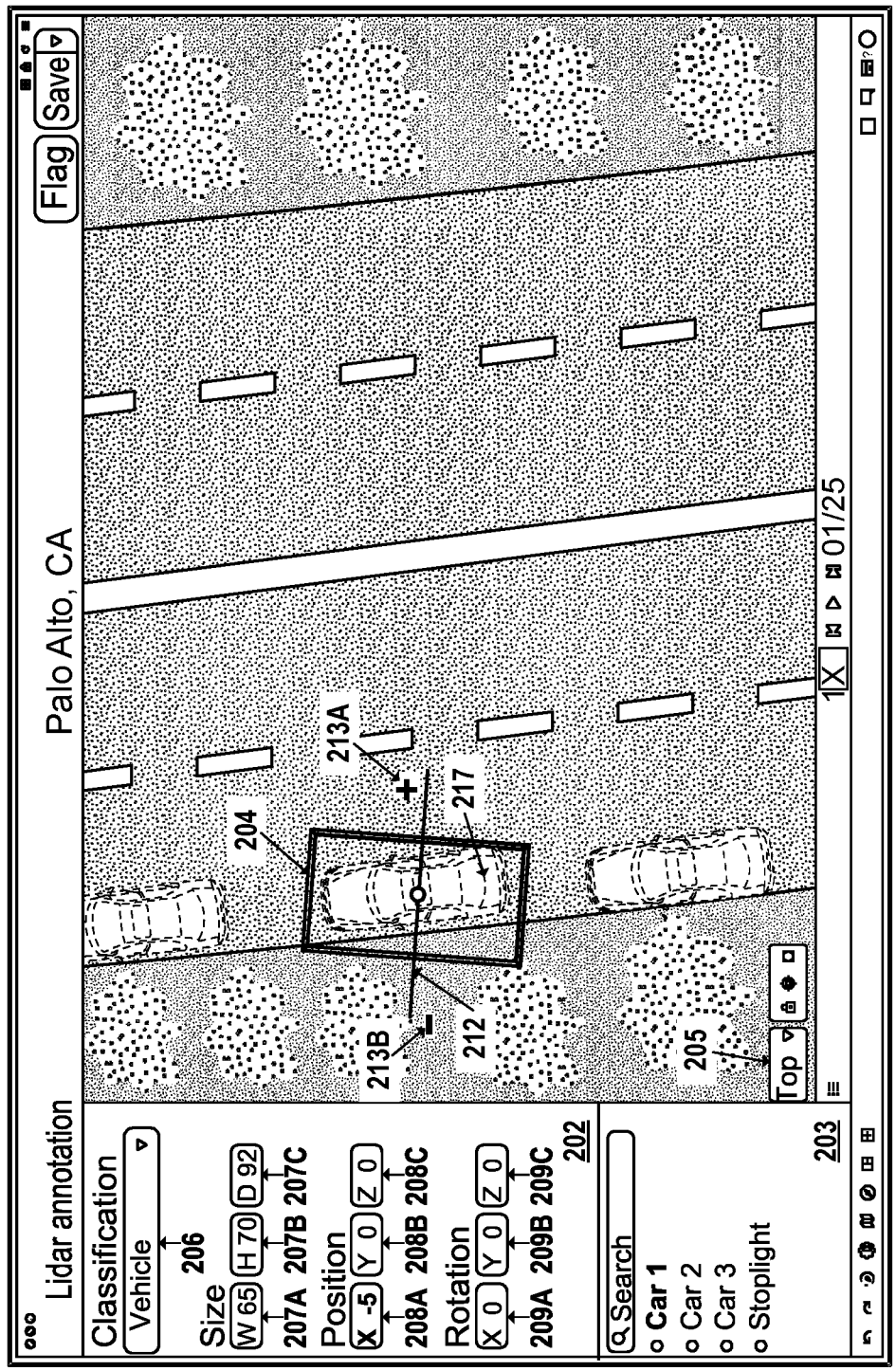
FIG. 2E depicts the example visualization of FIG. 2D with the position parameter of the virtual shape manipulated along the x-axis in accordance with the present disclosure.

In operation, after selecting the position manipulator 208A, the user may enter the type of input that is mapped to the decrement command in order to shift the virtual shape 204 negatively along the x-axis. In response, the value of the position parameter along the x-axis may be decreased and the visual shape 204 may be shifted along the x-axis in the direction indicated by the directional indicator 213B. The end result of shifting the virtual shape 204 negatively along the x-axis is illustrated in FIG. 2E, which shows that the position parameter of the virtual shape 204 along the x-axis has been decreased to −5 and the visualization pane 201 has been updated to reflect the shift in position of the virtual shape 204. Further, as shown in FIG. 2E, the dimensional indicator 212 has been shifted along the x-axis along with the virtual shape 204. In this respect, the dimensional indicator 212 may be displayed with respect to the current position of the virtual shape 204, even though the virtual shape 204 is no longer the centroid of its local coordinate system.

Figure 2F:
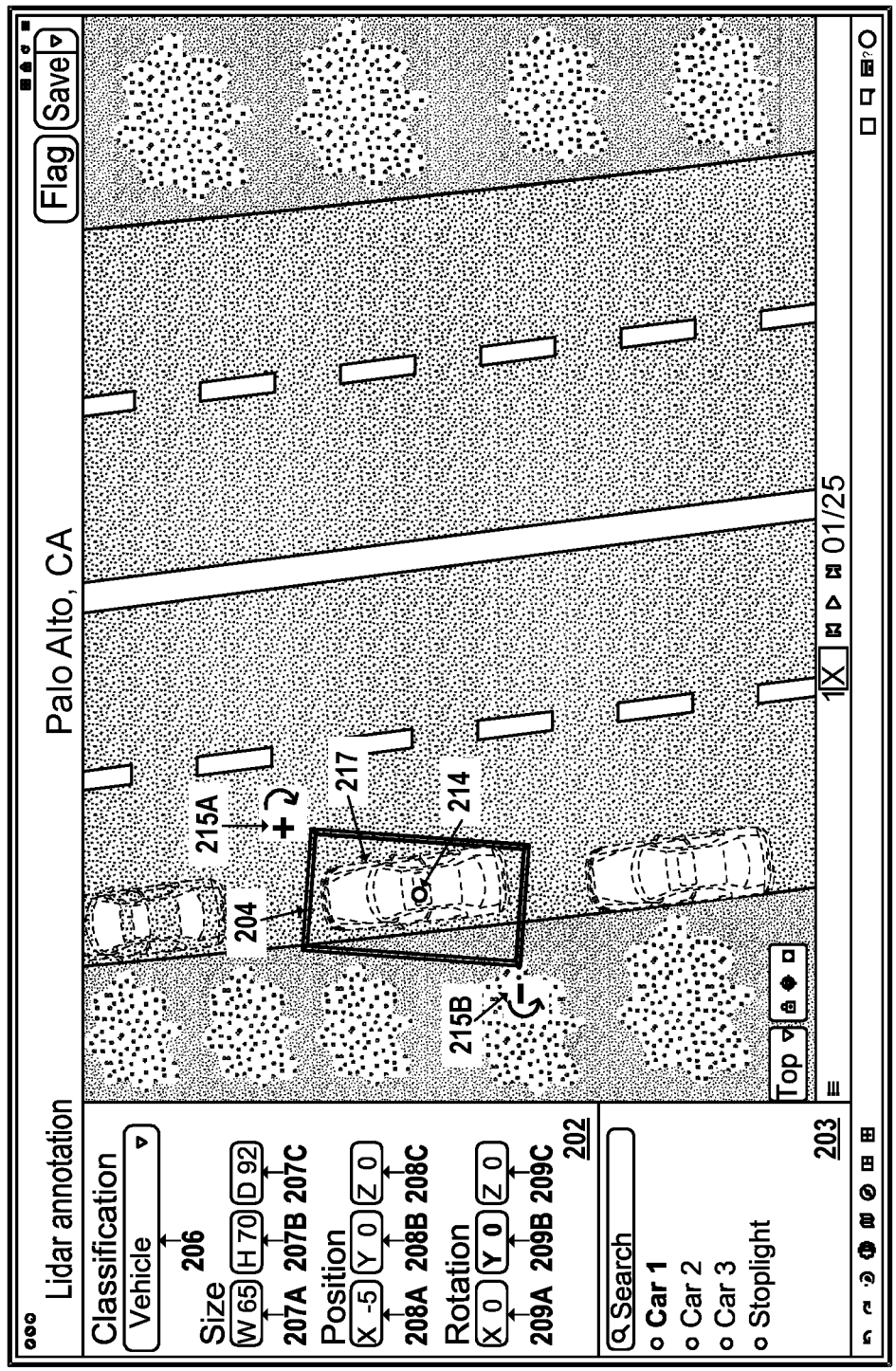
FIG. 2F depicts the example visualization of FIG. 2E with an orientation parameter of the virtual shape selected for manipulation about the y-axis in accordance with the present disclosure.

The user, after shifting the virtual shape along the x-axis, may determine that the size and position of the virtual shape 204 are acceptable, but may still desire to manipulate the orientation of the virtual shape 204 about the y-axis (e.g., manipulate the yaw of the virtual shape 204). To accomplish this, the user may first select the orientation manipulator 209B through the series of user inputs described above with respect to FIG. 2A. The end result of this selection of the orientation manipulator 209B is illustrated in FIG. 2F, which shows that the orientation parameter of the virtual shape 204 has been selected for manipulation about the y-axis.

In response to the selection of the orientation manipulator 209B to manipulate the orientation parameter of the virtual shape 204 about the y-axis, the virtual shape manipulation tool 200 may display, via visualization pane 201, dimensional indicator 214 and directional indicators 215A and 215B. The directional indicator 214 may function similarly to dimensional indicator 210 described above with respect to FIGS. 2B and 2C and dimensional indicator 212 described above with respect to FIGS. 2D and 2E but may be updated to inform the user that the user is about to make a manipulation to the orientation of the virtual shape about the y-axis. In this respect, as shown in FIG. 2F, the dimensional indicator 214 is a virtual y-axis, which appears as a circle because a top-down visualization of the virtual shape 204 is currently being displayed in the visualization pane 201.

Further in response to the selection to manipulate the orientation parameter of the virtual shape 204 about the y-axis, the virtual shape manipulation tool 200 may display, via visualization 201, directional indicators 215A and 215B. The directional indicators 215A and 215B may function similarly to directional indicators 211A and 211B described above with respect to FIGS. 2B and 2C and directional indicators 213A and 213B described above with respect to FIGS. 2D and 2E but may be updated to inform the user as to the respective directions about the y-axis the virtual shape 204 will be manipulated in response to respective types of user input. In this respect, as shown in FIG. 2F, the directional indicator 215A is a "+" that is accompanied by a clockwise-pointing arrow that indicates that inputting the type of user input that is mapped to the increment command will rotate the virtual shape 204 clockwise about the y-axis. Further, as shown, directional indicator 215B is a "−" sign that is accompanied by a counter-clockwise-pointing arrow that indicates to the user that inputting the type of user input that is mapped to the decrement command will rotate the virtual shape 204 counter-clockwise about the y-axis.

In operation, after selecting the orientation manipulator 208B, the user may enter the type of input that is mapped to the decrement command in order to rotate the virtual shape 204 counter-clockwise about the y-axis. In response, the value of the orientation parameter about the y-axis may be decreased and the virtual shape 204 may be rotated about the y-axis as indicated by the directional indicator 215B. The end result of rotating the virtual shape 204 counter-clockwise about the y-axis is illustrated in FIG. 2G, which shows that the orientation parameter of the virtual shape 204 about the y-axis has been decreased to −15 and the visualization pane 201 has been updated to reflect the change in rotation of the virtual shape 204.

Figure 2G:
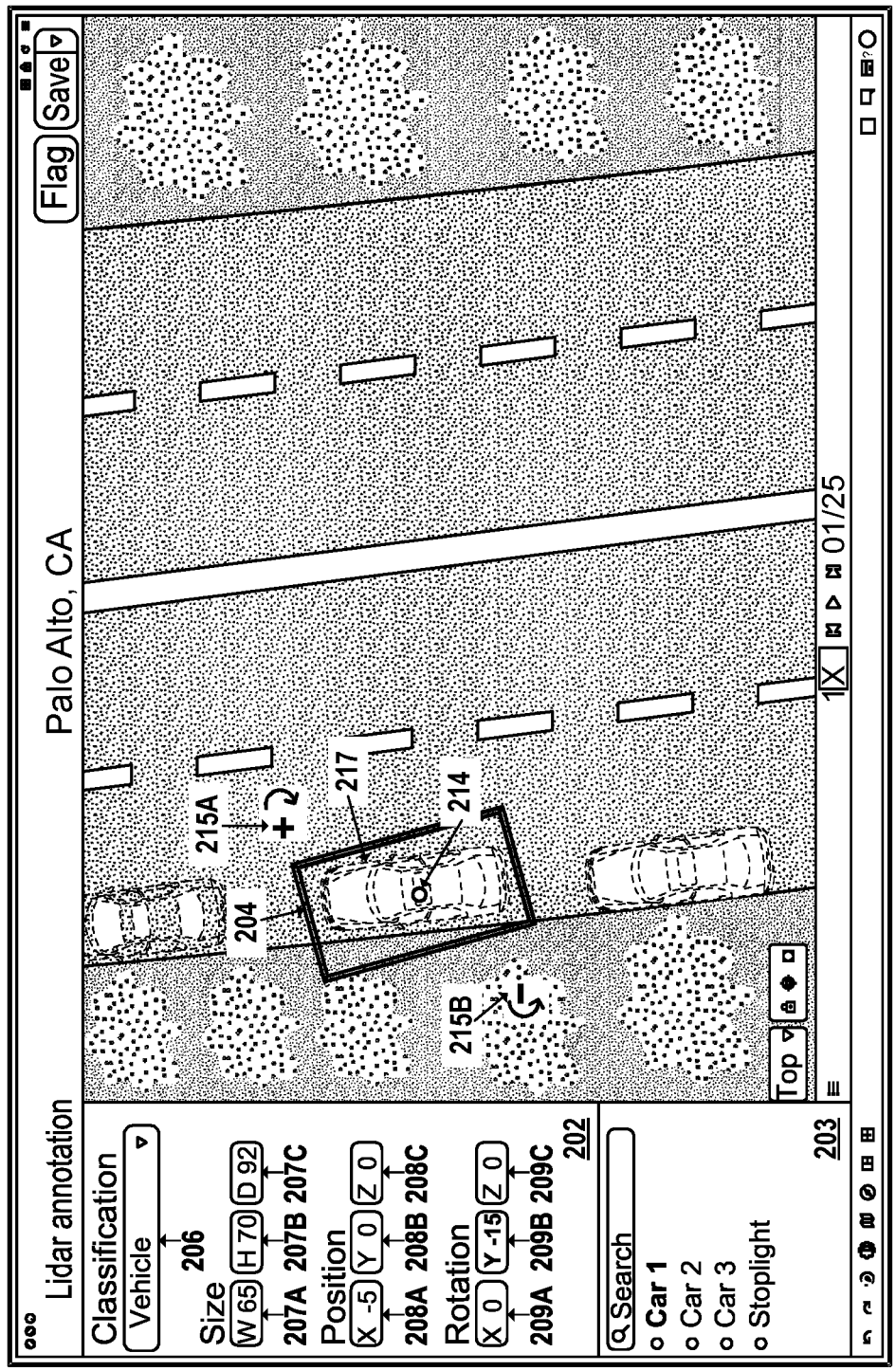
FIG. 2G depicts the example visualization of FIG. 2F with the orientation parameter of the virtual shape over-manipulated about the y-axis in accordance with the present disclosure.

However, as shown in FIG. 2G, the virtual shape 204 has been over rotated and thus does not align with the captured sensor data that represents the vehicle 217. In response, the user may determine that additional manipulations to the orientation of the virtual shape 204 about the y-axis are necessary. To accomplish this, the user may enter the type of input that is mapped to the increment command in order to rotate the virtual shape 204 clockwise about the y-axis. In response, the value of the orientation parameter about the y-axis may be increased and the virtual shape 204 may be rotated about the y-axis as indicated by the directional indicator 215A. The end result of rotating the virtual shape 204 clockwise about the y-axis is illustrated in FIG. 2H, which shows that the orientation parameter of the virtual shape 204 about the y-axis has been increased to −9 and the visualization pane 201 has been updated to reflect the change in rotation of the virtual shape 204.

Figure 2H:
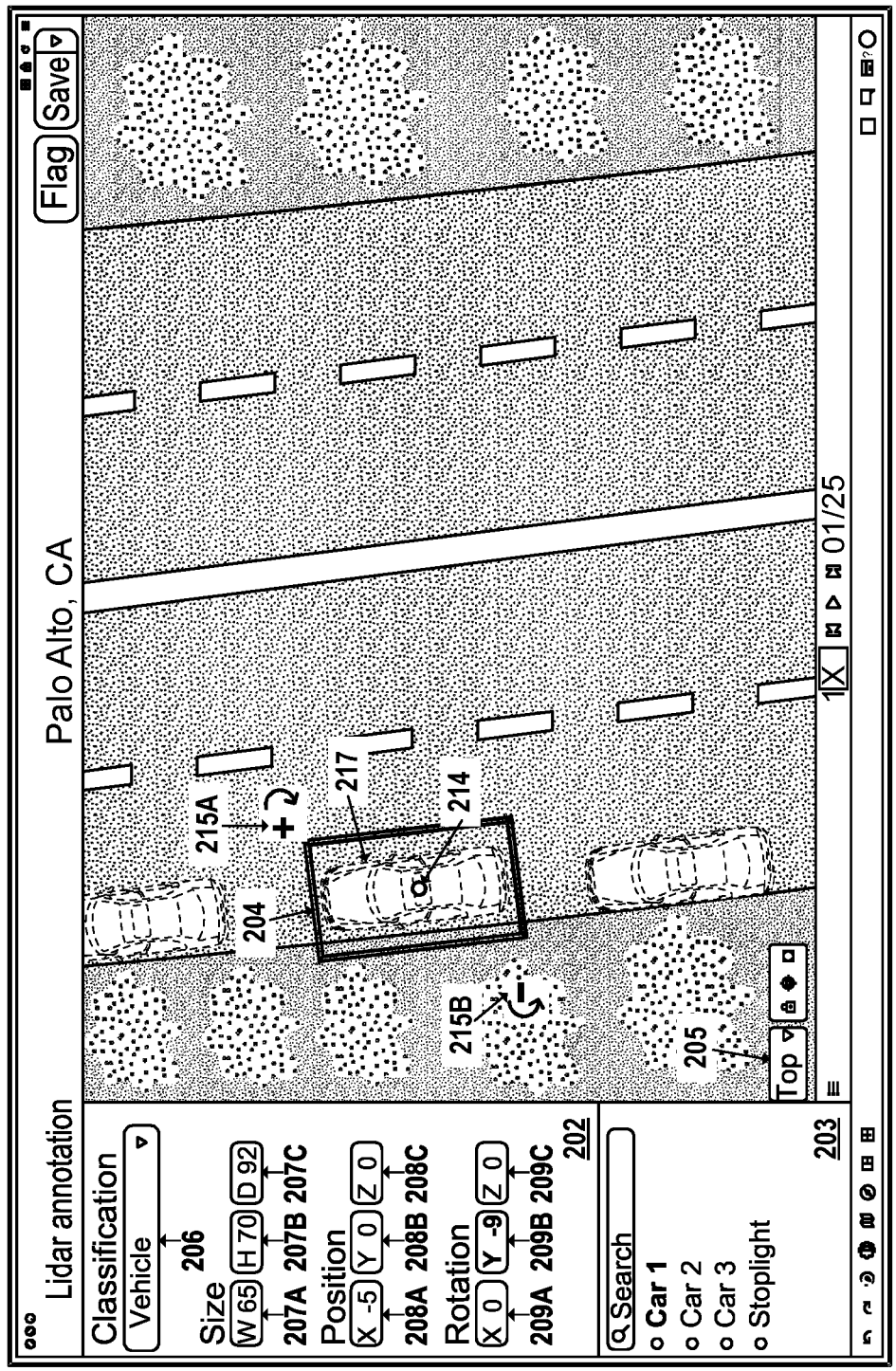
FIG. 2H depicts the example visualization of FIG. 2F with the orientation parameter of the virtual shape manipulated about the y-axis in accordance with the present disclosure.

As shown in FIG. 2H, the virtual shape 204 has been manipulated using the virtual shape manipulation tool 200 to fit to and/or aligned with the captured sensor data that represents the vehicle 217 to which the virtual shape 204 corresponds. However, as shown, the visualization pane 201 only shows one visualization of the virtual shape 204. In this respect, other visualizations of the virtual shape 204 may inform the user that further manipulations are required to ensure the virtual shape 204 is sufficiently aligned to the captured sensor data that represents the vehicle 217. In turn, the user may desire to generate an additional visualization to confirm that the virtual shape 204 does not require further manipulations.

To accomplish this, the user may (i) navigate to the visualization selector 205 through the series of user inputs described above with respect to FIG. 2A, and (ii) select an additional visualization to be displayed within the visualization pane 201, such as the custom visualization. The end result of this navigation to the visualization selector 205 and subsequent selection of the custom visualization is illustrated in FIG. 2I, which shows that an additional custom visualization of the virtual shape 204 has been displayed within the visualization pane 201.

Figure 2I:
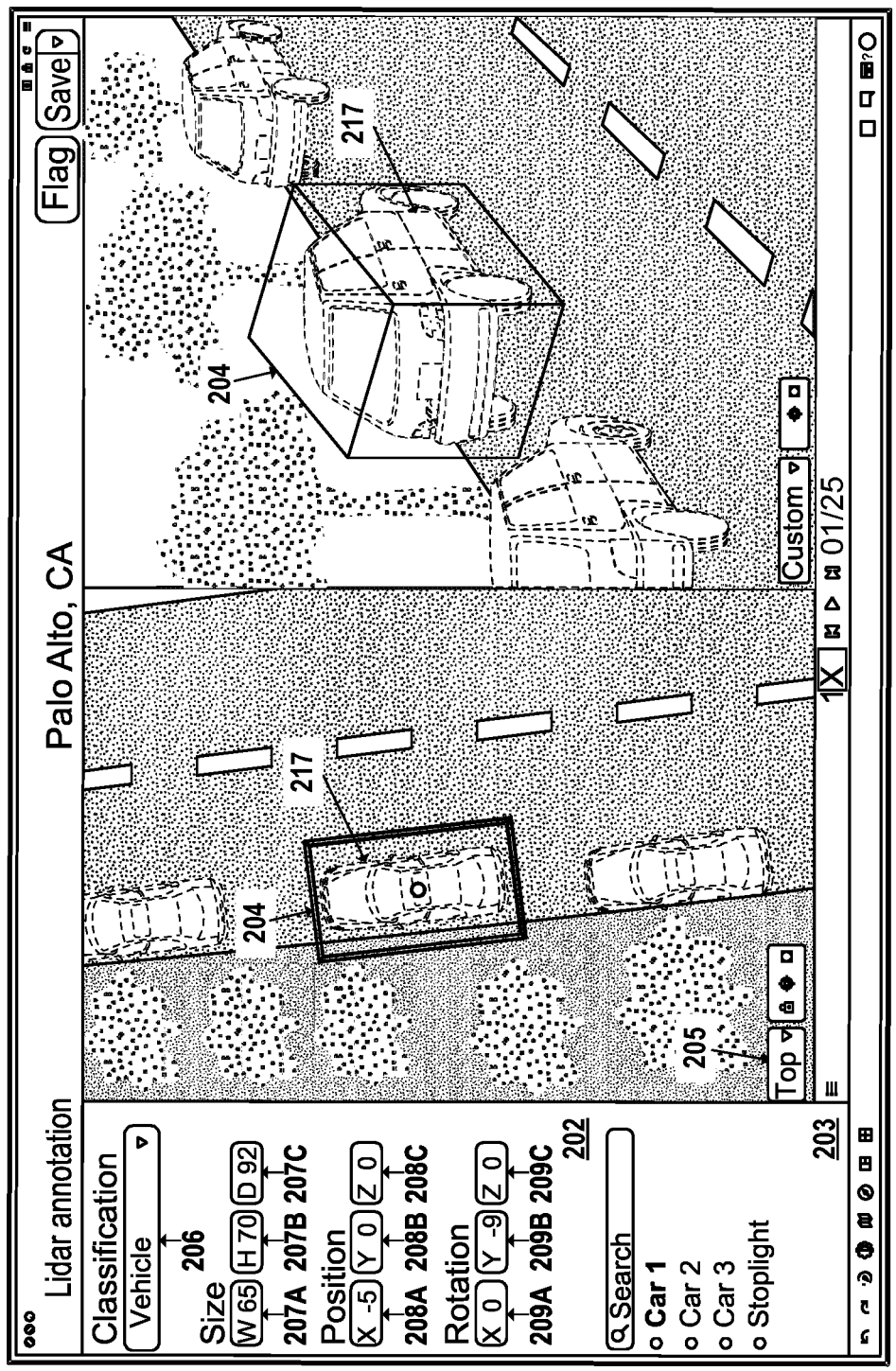
FIG. 2I depicts the example visualization of FIG. 2G showing an additional view of the virtual shape in accordance with the present disclosure.

As shown in FIG. 2I, the visualization pane 201 depicts the top-down visualization of the virtual shape 204 illustrated in FIGS. 2A-2H along with an additional custom visualization of the virtual shape 204. Further, as shown, the custom visualization of the virtual shape 204 indicates that the virtual shape 204 fits the vehicle 217 that appears in the sensor data. In turn, the user has a higher level of confidence that the manipulations to the virtual shape 204 successfully encompasses and is aligned with the vehicle 217 that appears in the sensor data.

Figure 2J:
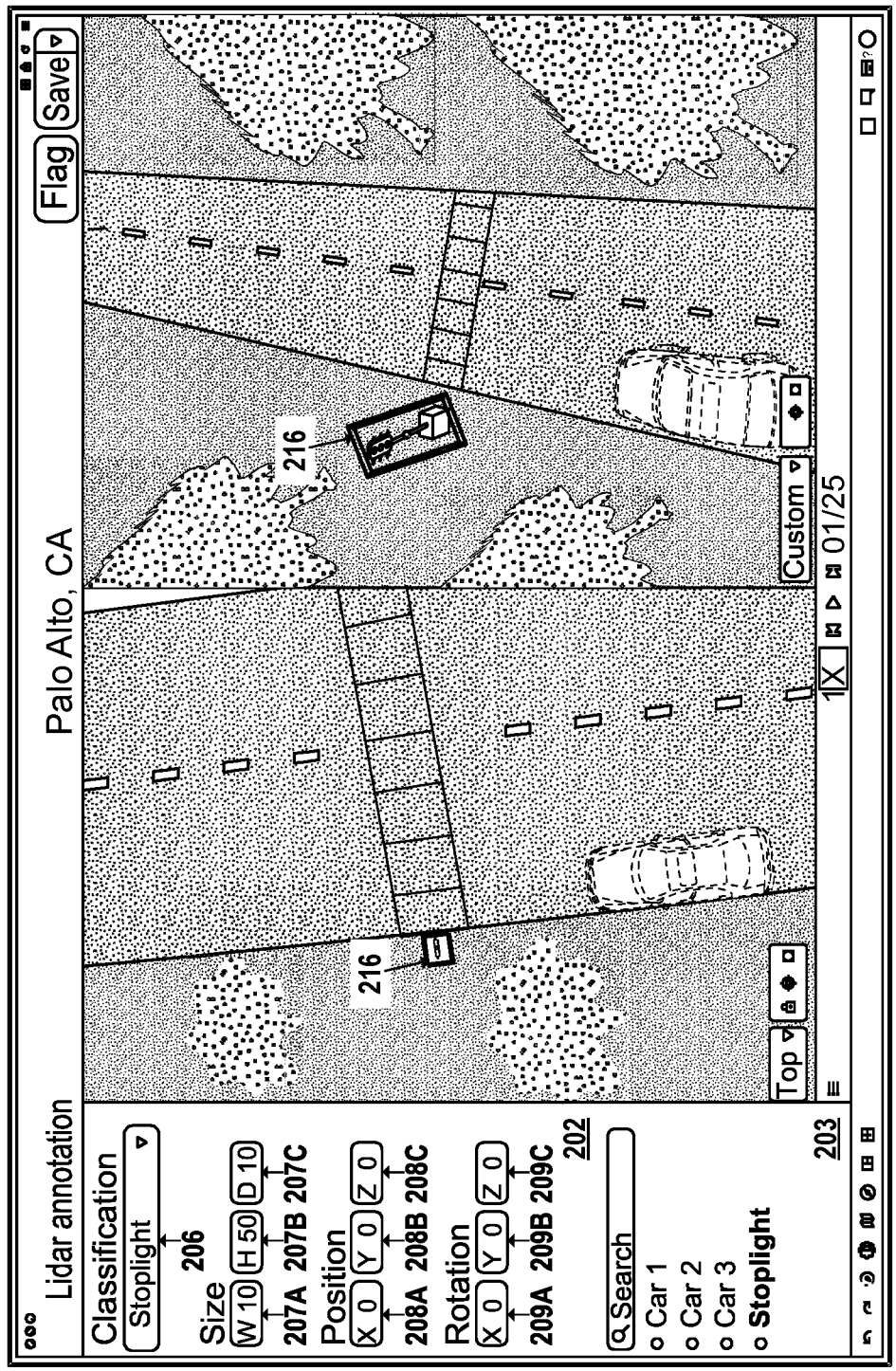
FIG. 2J depicts the example visualization of FIG. 2H showing a different virtual shape in the 3D space in accordance with the present disclosure.

Once the user is satisfied with the manipulations made to virtual shape 204, the user can move forward with making manipulations to other virtual shapes. To accomplish this, as described above, the user may provide the user input described above with respect to FIG. 2A that is configured to switch the displayed virtual shape via the selection pane 203. For example, the user may press the right-arrow key on a keyboard to cause the virtual manipulation tool 200 to display a different virtual shape than virtual shape 204. The end result of this interaction is illustrated in FIG. 2J, which shows an updated visualization pane 201 that displays a virtual shape 216. As shown in FIG. 2J, the virtual shape 216 corresponds to captured sensor data that is representative of a stoplight. It should be understood that the stoplight object to which the virtual shape 216 corresponds is illustrated as having distinct borders for the purposes of illustration only, and that in practice, the stoplight may actually appear as a dense set of points within the sensor data.

In practice, when the visualization pane 201 is updated to display the virtual shape 216, the manipulation pane 202 and the selection pane 203 may also be updated to reflect the parameter values associated with the virtual shape 216. For instance, as shown in FIG. 2J, the stoplight has a width of 10, height of 50, and depth of 10. Further, the values of the position and orientation parameters of the virtual shape are zero because, as discussed above, the virtual shape 216 is the centroid of its own local coordinate system, which is independent of the any of the coordinate systems used by the other virtual shapes available for manipulation in the selection pane 203, including the virtual shape 204.

Once the virtual shape 216 is displayed within the visualization pane 201, the user can perform any of the manipulations described above with respect to FIGS. 2A-2H above, or additional or different manipulations.

As illustrated in the example described above with respect to FIGS. 2A-2J above, the disclosed tool for virtual shape manipulation can be utilized as an improved way to label objects in sensor data, which in turn may reduce the time and cost associated with curating the sensor data. Further, as noted above, the sensor data that is curated using the disclosed tool may then be used for various purposes, including training object detection or other machine learning models and building maps, among other purposes.

While the disclosed tool is described above with respect to manipulating virtual shapes that represent objects of interest in captured sensor data, as discussed above, the disclosed tool may also be used to provide improvements in other areas of technology and for other applications, such as technology areas that involve the creation of 3D models of real-world environments (e.g., architecture, construction, etc.).

Figure 3:
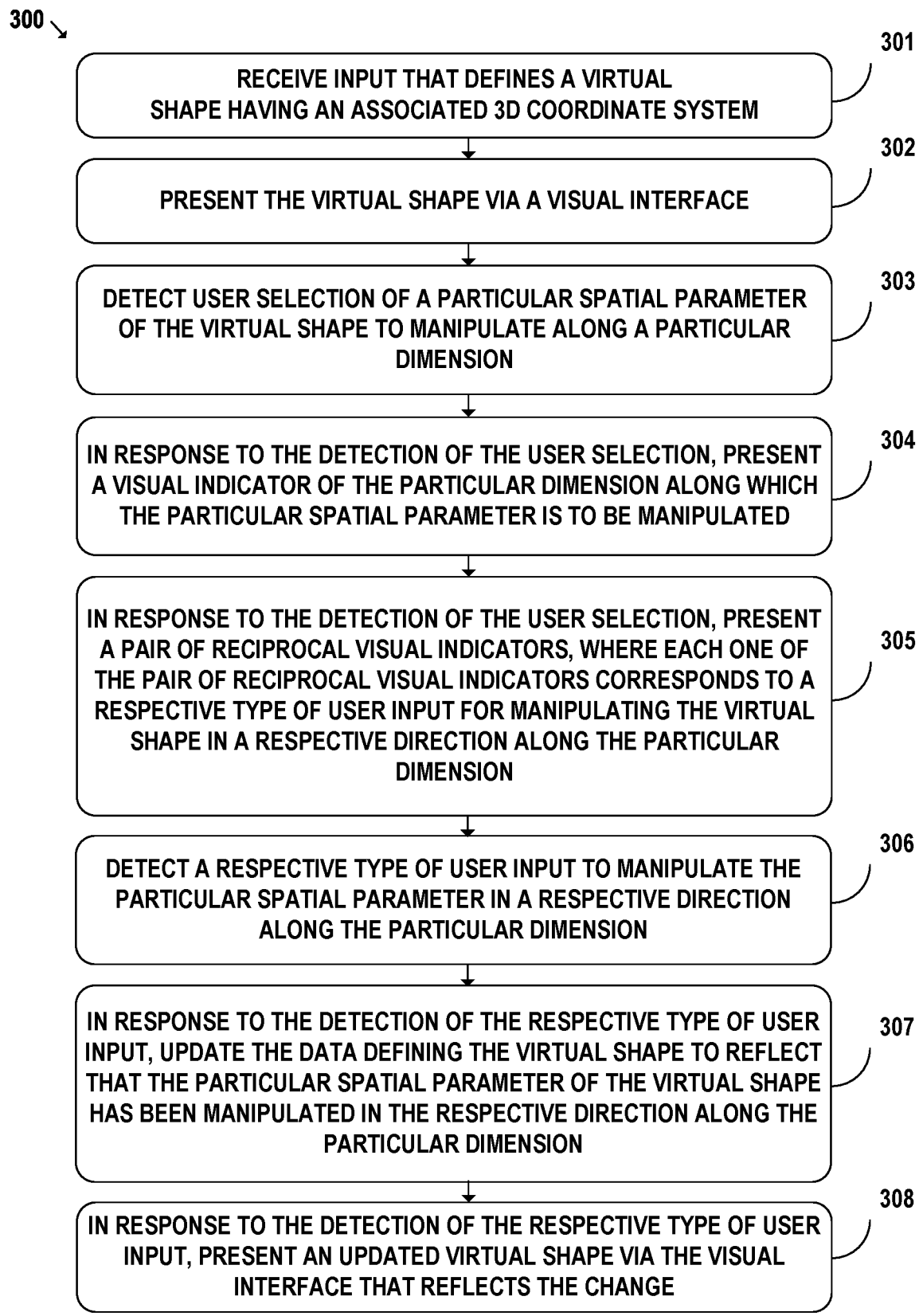
FIG. 3 depicts a flow diagram of example functions that a virtual shape manipulation tool may be configured to perform.

Turning now to FIG. 3, a simplified block diagram 300 is shown that illustrates one example embodiment of a process for manipulating virtual shapes using the disclosed tool. This example embodiment is described as being carried out by a client station that is provisioned with the disclosed tool for virtual shape manipulation, which may take the form of the client station described with respect to FIG. 4 below. However, while this example embodiment is described as being carried out by a single client station that is provisioned with the disclosed tool, it should be understood that the example embodiment can be carried out by a plurality of client stations, and/or a computing system of which a client station is a part (e.g., a cloud-based, distributed, and/or web-based computing system). Likewise, it should be understood that the disclosed tool is merely described in this manner for the sake of clarity and explanation and that the example embodiment may be implemented in various other manners, including the possibility that functions may be added, removed, rearranged into different orders, combined into fewer blocks, and/or separated into additional blocks depending upon the particular embodiment.

As shown in FIG. 3, the block diagram 300 may begin at block 301 with a client station receiving input that defines a virtual shape having an associated 3D coordinate system (e.g., a local coordinate system for the virtual shape) that is used to define the spatial parameters of the virtual shape (e.g., the size, position, and orientation of the virtual shape). The received input may take various forms.

As one example, the received input may come from an autolabeling pipeline, which may be configured to automatically generate virtual shapes that take the form of labels for sensor data. The sensor data that is labelled may take various forms. As one possibility, the sensor data may include light detecting and ranging (LiDAR) data. As another possibility, the sensor data may include image data (including video data). As yet another possibility, the sensor data may include telematics data (e.g., Inertial Measurement Unit (IMU) data and/or Global Positioning System (GPS) data). The sensor data may take other forms as well. Further, the sensor data that is to be labelled may be fused together and processed using a technique such as Simultaneous Localization and Mapping (SLAM). After the sensor data is processed, object detection techniques may be applied to generate labels for objects that appear within the sensor data.

As another example, the received input may be input that defines a virtual shape that was previously created by a user. For instance, the received input may take the form of an input that defines a label for an object appearing in processed sensor data such as that described above. It should be understood that the received input may be stored by the client station for future use. The received input may take other forms as well.

Further, the virtual shape may take various forms. As one possibility, the virtual shape may take the form of a label for an object that appears in the sensor data, which may take various forms as well. As one example, the label may take the form of a 2D polygon or a 3D polyhedron, depending on the classification of the object that appears in the sensor data. For instance, if the labeled object is two-dimensional, such as a ground marking (e.g., a right turn arrow painted on the street), the label may take the form of a 2D polygon that is fit to the shape of the ground marking. In practice, the 2D polygon may take various forms, such as a 2D bounding box or a 2D convex hull, among other possibilities. Further, if the labeled object is three-dimensional, such as an agent (e.g., a dynamically moving 3D object) or a traffic control element (TCE) (e.g., a stoplight, traffic sign, etc.), the label may take the form of a 3D polyhedron that is fit to the shape of the 3D object. In practice, the 3D polyhedron may take various forms, such a 3D bounding box or a 3D convex hull, among other possibilities.

As another possibility, the virtual shape may take the form of a virtual representation of an object in a real-world environment for which a 3D model is being built. For instance, the virtual shape may comprise a virtual representation of a machine for which a 3D model is being built to assist in the creation of toolpaths, etc.

The virtual shape may take other forms as well.

At block 302, the client station may present the virtual shape via a visual interface. The visual interface may take various forms. As one example, the visual interface may be a display screen of a device that a user may use to manipulate the virtual shape (e.g., computer, tablet, phone, etc.). The visual interface may take other forms as well.

The function of presenting the virtual shape via the visual interface may take various forms that depend on the form of the virtual shape. For instance, in an implementation where the virtual shape comprises a label of a given object (e.g., a vehicle) appearing within sensor data that is representative of a real-world environment, presenting the virtual shape may involve presenting a visualization of the sensor data representing the real-world environment that includes the label. Such a visualization may take various forms, one example of which was previously discussed with regard to the visualization pane 201 in FIGS. 2A-2J. In this respect, such a visualization may present one or more views of the virtual shape. Further, such a visualization may be configurable to define either one view, or a plurality of views of the virtual shape. The views may take various forms, including a top-down view, a front view, a side view, a dashcam view, and/or a custom view that is configurable by the user, among other possibilities. Such a visualization may take other forms as well.

The function of presenting the virtual shape via the visual interface may take other forms as well, including the possibility that the virtual shape is presented on its own (as opposed to being presented together with other data and/or virtual shapes).

As noted above, along with presenting such a visualization of the virtual shape, the disclosed tool may also present other UI elements to facilitate review and manipulation of the virtual shape. For example, as described above with respect to FIGS. 2A-2J, along with the visualization pane, the disclosed tool may also present a manipulation pane, such as manipulation pane 202, and a virtual shape selection pane, such as selection pane 203. Those additional panes may help facilitate the review and manipulation of the virtual shape.

At block 303, the computing device may detect user selection of a particular spatial parameter of the virtual shape to manipulate along a particular dimension. The detected user input may take various forms. As one possibility, the detected user input may take the form of a keyboard input. The keyboard input may take various forms. As one example, the keyboard input may take the form of a "TAB" key that causes the disclosed tool to enter a manipulation mode. As another example, the keyboard input may take the form of a user-definable key binding that is configured to cause the disclosed tool to enter the manipulation mode. The keyboard input may take other forms as well.

As another possibility, the detected user input may take the form of a mouse input. The mouse input may take various forms. As one example, the mouse input may take the form of a click when a mouse pointer is positioned over the particular spatial parameter of the virtual shape the user is to manipulate. As another example, the mouse input may take the form of a scroll of the mouse wheel, where the disclosed tool is configured to enter the manipulation mode when a user scrolls to a particular spatial parameter of the virtual shape. The mouse input may take other forms as well.

As yet another possibility, the detected user input may take the form of a touchscreen input. The touchscreen input may take various forms. As one example, the touchscreen input may take the form of a press of an area of a touchscreen that is associated with the particular spatial parameter of the virtual shape the user is to manipulate. The touchscreen input may take other forms as well.

The detected user input may take other forms as well, including but not limited to the possibility that the detected user input may comprise a combination of keyboard, mouse, and touchscreen input.

At block 304, in response to the detection of the user selection, the client station may present a visual indicator of the particular dimension along which the particular spatial parameter is to be manipulated.

The visual indicator of the particular dimension may take various forms, one example of which was previously discussed with regard to the dimensional indicators 210, 212, and 214 in FIGS. 2A-2J. In this respect the visual indicator may take the form of a virtual axis line that corresponds to the particular dimension along which a particular spatial parameter of the virtual shape is being manipulated. As one example, if the particular spatial parameter corresponds to a size, position, or orientation parameter of the virtual shape along the x-axis, the virtual axis line may take the form of a virtual x-axis. As another example, if the particular spatial parameter corresponds to a size, position, or orientation parameter of the virtual shape along the y-axis, the virtual axis line may take the form of a virtual y-axis. As yet another example, if the particular spatial parameter corresponds to a size, position, or orientation parameter of the virtual shape along the z-axis (e.g., depth), the virtual axis line may take the form of a virtual z-axis. Other examples may exist.

In practice, the virtual axis line is shown with respect to a coordinate system that is local to the virtual shape. For instance, as described above with respect to FIG. 2A, each virtual shape shown in the disclosed tool may have a respective local coordinate system in which the virtual shape is at the center. In this respect, each of the x-axis, y-axis, and z-axis position and orientation parameters of the virtual shape may be generated with a value of 0. The function of presenting a virtual axis line that is based on a coordinate system local to the virtual shape may be particularly beneficial as it provides a user with a clear starting point for potential manipulations, since the user can track position and orientation manipulations from zero.

The visual indicator of the particular dimension may take other forms as well.

Further, the visual indicator of the particular dimension may remain visible to the user regardless of the type of visualization the user has selected. For instance, if the user defines a custom view that rotates the visualization by 90 degrees, the visual indicator will rotate with the visualization. This may be beneficial to the user as it allows the user to maintain a sense of the dimension along which the manipulation will take place.

At block 305, in response to the detection of the user selection, the client station may present a pair of reciprocal visual indicators, where each one of the pair of reciprocal visual indicators corresponds to a respective type of user input for manipulating the virtual shape in a respective direction along the particular dimension.

The pair of reciprocal visual indicators may take various forms, one example of which was previously discussed with regard to the directional indicators 211A, 211B, 213A, 213B, 215A, and 215B in FIGS. 2A-2J. In this respect, the pair of reciprocal visual indicators may take the form of "+" and "−" signs that are presented along the particular dimension. In this respect, the pair of reciprocal visual indicators serve to indicate to the user the direction along the particular dimension the manipulation will be made.

Each visual indicator in the pair may correspond to a respective type of user input for manipulating the virtual shape. The respective type of user input may take various forms. As one example, the respective type of user input may take the form of specific keyboard-based commands (e.g., arrow keys, numpad, etc.). As another example, the respective type of user input may take the form of virtual buttons that can be selected via a mouse or if the disclosed tool is implemented on a touch-capable device, a touch screen. The respective type of user input may take other forms as well.

Further, using specific keyboard-based commands to manipulate the virtual shape along the particular dimension may advantageously allow a user to make fine-grain manipulations, including manipulations as small as one pixel. As discussed above, existing tools for virtual shape manipulation generally utilize user input that is based on mouse-based commands (e.g., gizmos). However, using mouse-based commands to manipulate a virtual shape can often be imprecise, requiring the user to make corrective manipulations. In contrast, the keyboard-based commands utilized by the disclosed tool may reduce the occurrence of these corrective manipulations, which in turn may increase the efficiency of the user's manipulations of the virtual shape.

Additionally, the pair of reciprocal visual indicators, similarly to the visual indicator of the particular dimension, may remain visible to the user regardless of the type of visualization the user has selected. This is particularly beneficial as it allows the user to maintain a high level of confidence that the manipulation will be executed as intended.

It should also be understood that, in other implementations, the client station may function to present only a single visual indicator, as opposed to a pair of reciprocal visual indicators. For instance, in response to the detecting a user selection of a particular spatial parameter of the virtual shape to manipulate along a particular dimension of the 3D coordinate system, the client station may function to present a single visual indicator to inform the user that the particular spatial parameter of the virtual shape will be manipulated in a first specified direction along the particular dimension in response to one specified type of user input (e.g., an increment command), and based on this single visual indicator, the user may then be able to infer that the particular spatial parameter of the virtual shape will be manipulated in a second, opposite direction along the particular dimension in response to a reciprocal type of user input (e.g., a decrement command).

At block 306, the client station may detect a respective type of user input to manipulate the particular spatial parameter in a respective direction along the particular dimension. In operation, detecting the respective type of user input may involve detecting an activation of the respective type of user input. In one example, the function of detecting the respective type of user input may involve detecting that a user has pressed the up-arrow key or down-arrow key to manipulate the particular spatial parameter of the virtual shape.

At block 307, in response to the detection of the respective type of user input, the client station may update the data defining the virtual shape to reflect that the particular spatial parameter of the virtual shape has been manipulated in the respective direction along the particular dimension.

As discussed above, each of the virtual shape's parameters may have an associated value (e.g., a height of 121, an x-axis position of 25, etc.). In this respect, updating the data defining the virtual shape may involve incrementing or decrementing a respective value of the virtual shape's parameters based on the respective type of user input detected in block 306. Further, as discussed above, the amount the respective value of the virtual shape's parameters is incremented or decremented based on the respective type of user input detected in block 306 may be a fixed amount that is constant across each instance of the type of user input. For instance, the associated value of the virtual shape's parameters may be incremented or decremented by the same amount (e.g., 1, 3, 5, etc.) each time the respective type of user input is detected.

For instance, if the height parameter of the virtual shape is 121 and the user manipulates the height parameter by entering a respective type of user input that corresponds to incrementing the height parameter, then the client station may update the height parameter of the virtual shape to reflect a value of 122.

At block 308, in response to the detection of the respective type of user input, the client station may present an updated virtual shape via the visual interface that reflects the change. The function of presenting the updated virtual shape via the visual interface may take various forms that depend on the form of the virtual shape. For instance, in an implementation where the virtual shape comprises a label of a given object (e.g., a vehicle) appearing within sensor data that is representative of a real-world environment, presenting the updated virtual shape via the visual interface may involve presenting an updated visualization of the sensor data representing the real-world environment that includes a label that reflects the change. The function of presenting the updated virtual shape via the visual interface may take other forms as well.

In practice, presenting the updated virtual shape via the visual interface may involve applying the manipulation to the virtual shape presented via the visual interface. In this respect, the user can see each manipulation as it is being made in order to efficiently determine whether subsequent manipulations need to be made.

Further, the client station may repeat one or more of blocks 301-308 as a user continues to use the disclosed tool to manipulate virtual shapes. In addition to performing the functions described in blocks 301-308, the client station may also perform other functions while running the disclosed tool, such as those described above with respect to FIGS. 2A-2J. As a result, the client station is capable of providing a user with a tool that empowers the user to make precise, well-informed manipulations.

Figure 4:
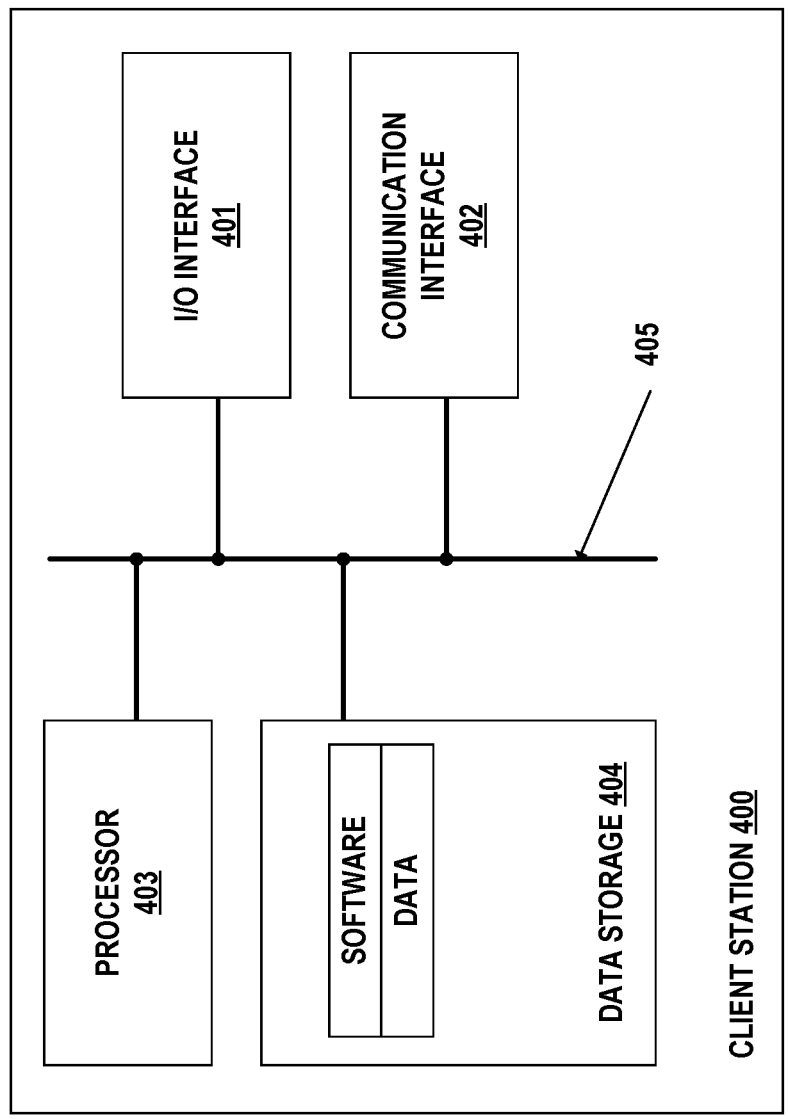
FIG. 4 depicts a simplified block diagram that illustrates some structural components that may be included in an example computing platform.

Turning now to FIG. 4, a simplified block diagram is provided that illustrates some structural components that may be included in an example client station 400, which may be configured to carry out any of the various functions disclosed herein, including but not limited to the functions described above with reference to FIGS. 2A-2J and FIG. 3. In line with the discussion above, client station 400 may generally comprise an I/O interface 401, a communication interface 402, a processor 403, and data storage 404, all of which may be communicatively linked by a communication link 405 that may take the form of a system bus or the like.

I/O interface 401 may generally take the form of (i) one or more input interfaces that are configured to receive and/or capture information at client station 400 and (ii) one or more output interfaces that are configured to output information from client station 400 (e.g., for presentation to a user). In this respect, the one or more input interfaces of I/O interface 401 may include or provide connectivity to input components such as a microphone, a camera, a keyboard, a mouse, a trackpad, a touchscreen, and/or a stylus, among other possibilities. In turn, the one or more output interfaces of I/O interface 401 may include or provide connectivity to output components such as a display screen and/or an audio speaker, among other possibilities.

Communication interface 402 may take the form of any one or more interfaces that facilitate communication between client station 400 and other computing entities, such as a remote computing platform and/or other client stations. In this respect, each such interface may be wired and/or wireless and may communicate according to any of various communication protocols, examples of which may include Ethernet, Wi-Fi, cellular network, serial bus (e.g., Universal Serial Bus (USB) or Firewire), and/or short-range wireless protocols, among other possibilities.

Processor 403 may comprise one or more processor components, such as general-purpose processors (e.g., a single- or multi-core microprocessor), special-purpose processors (e.g., an application-specific integrated circuit or digital-signal processor), programmable logic devices (e.g., a field programmable gate array), controllers (e.g., microcontrollers), and/or any other processor components now known or later developed. In line with the discussion above, it should also be understood that processor 403 could comprise processing components that are distributed across a plurality of physical computing devices connected via a network, such as a computing cluster of a public, private, or hybrid cloud, among other possibilities.

In turn, data storage 404 may comprise one or more non-transitory computer-readable storage mediums, examples of which may include volatile storage mediums such as random-access memory, registers, cache, etc. and non-volatile storage mediums such as read-only memory, a hard-disk drive, a solid-state drive, flash memory, an optical-storage device, etc. The one or more non-transitory computer-readable storage mediums are collectively configured to store (i) program instructions that are executable by processor 403 such that client station 400 is configured to perform some or all of the functions disclosed herein (including but not limited to the functions described above with respect to FIGS. 2A-2J and FIG. 3), and (ii) data that may be captured, received, derived, or otherwise stored by client station 400 in connection with the disclosed tool for virtual shape manipulation.

It should be understood that client station 400 is one example of a client station that may be used with the example embodiments described herein. Numerous other arrangements are possible and contemplated herein. For instance, other client stations may include additional components not pictured and/or more or less of the pictured components.

CONCLUSION

This disclosure makes reference to the accompanying figures and several example embodiments. One of ordinary skill in the art should understand that such references are for the purpose of explanation only and are therefore not meant to be limiting. Part or all of the disclosed systems, devices, and methods may be rearranged, combined, added to, and/or removed in a variety of manners without departing from the true scope and spirit of the present invention, which will be defined by the claims.

Further, to the extent that examples described herein involve operations performed or initiated by actors, such as "humans," "curators," "users" or other entities, this is for purposes of example and explanation only. The claims should not be construed as requiring action by such actors unless explicitly recited in the claim language.

We claim:

1. A computer-implemented method comprising:
    presenting, via a visual interface, a virtual shape associated with a three-dimensional (3D) coordinate system;
    presenting, via the visual interface, a visual indicator positioned in proximity to the virtual shape and indicating that a specified spatial parameter of the virtual shape will be modified along a specified dimension of the 3D coordinate system in response to a given type of user input associated with the visual indicator;
    while presenting the visual indicator, detecting an instance of the given type of user input associated with the visual indicator; and
    after detecting the instance of the given type of user input, updating the virtual shape that is presented via the visual interface by modifying the specified spatial parameter of the virtual shape along the specified dimension,
    wherein the visual indicator comprises a first visual indicator and a second visual indicator, wherein the first visual indicator indicates a first direction along the specified dimension in which the specified spatial parameter of the virtual shape will be incremented in response to a first type of user input, and
    wherein the second visual indicator indicates a second direction along the specified dimension in which the specified spatial parameter of the virtual shape will be decremented in response to a second type of user input.

2. The computer-implemented method of claim 1, further comprising:
    before presenting the visual indicator, detecting a user selection of the specified spatial parameter and the specified dimension of the 3D coordinate system, wherein the detecting of the user selection responsively triggers the presenting of the visual indicator.

3. The computer-implemented method of claim 1, wherein the visual indicator comprises the first visual indicator indicating that the specified spatial parameter of the virtual shape will be incremented along the specified dimension of the 3D coordinate system in response to receiving the first type of user input associated with the first visual indicator, and wherein the method further comprises:
    presenting, via the visual interface, the second visual indicator positioned in proximity to the virtual shape and indicating that the specified spatial parameter of the virtual shape will be decremented along the specified dimension of the 3D coordinate system in response to the second type of user input associated with the second visual indicator.

4. The computer-implemented method of claim 3, further comprising:
    after detecting the instance of the first type of user input and updating the virtual shape that is presented via the visual interface by incrementing the specified spatial parameter of the virtual shape along the specified dimension, detecting an instance of the second type of user input associated with the second visual indicator; and
    after detecting the instance of the second type of user input, updating the virtual shape that is presented via the visual interface by decrementing the specified spatial parameter of the virtual shape along the specified dimension.

5. The computer-implemented method of claim 1, wherein the specified spatial parameter comprises a size parameter, and wherein modifying the specified spatial parameter of the virtual shape comprises one of (i) incrementing or decrementing a width of the virtual shape if the specified dimension comprises an x-axis of the 3D coordinate system, (ii) incrementing or decrementing a height of the virtual shape if the specified dimension comprises a y-axis of the 3D coordinate system, or (iii) incrementing or decrementing a depth of the virtual shape if the specified dimension comprises a z-axis of the 3D coordinate system.

6. The computer-implemented method of claim 1, wherein the specified spatial parameter comprises a position parameter, and wherein modifying the specified spatial parameter of the virtual shape comprises one of (i) incrementing or decrementing a position of the virtual shape along an x-axis of the 3D coordinate system if the specified dimension comprises the x-axis of the 3D coordinate system, (ii) incrementing or decrementing the position of the virtual shape along a y-axis of the 3D coordinate system if the specified dimension comprises the y-axis of the 3D coordinate system, or (iii) incrementing or decrementing the position of the virtual shape along a z-axis of the 3D coordinate system if the specified dimension comprises the z-axis of the 3D coordinate system.

7. The computer-implemented method of claim 1, wherein the specified spatial parameter comprises an orientation parameter, and wherein modifying the specified spatial parameter of the virtual shape comprises one of (i) incrementing or decrementing a pitch of the virtual shape if the specified dimension comprises an x-axis of the 3D coordinate system, (ii) incrementing or decrementing a yaw of the virtual shape if the specified dimension comprises a y-axis of the 3D coordinate system, or (iii) incrementing or decrementing a roll of the virtual shape if the specified dimension comprises a z-axis of the 3D coordinate system.

8. The computer-implemented method of claim 1, wherein the virtual shape comprises a label of an object detected within sensor data that is representative of a real-world environment, wherein the sensor data comprises one or more of Light Detecting and Ranging (LiDAR) data, image data, or telematics data.

9. The computer-implemented method of claim 8, wherein presenting the virtual shape comprises:
   presenting, via the visual interface, a visualization of the sensor data that includes the label of the object detected within the sensor data.

10. The computer-implemented method of claim 1, further comprising:
    detecting one or more additional instances of the given type of user input associated with the visual indicator; and
    further updating the virtual shape that is presented via the visual interface by further modifying the specified spatial parameter of the virtual shape along the specified dimension.

11. The computer-implemented method of claim 1, further comprising:
    presenting, via the visual interface, a representation of an object associated with the virtual shape, and
    wherein, after updating the virtual shape that is presented via the visual interface by modifying the specified spatial parameter of the virtual shape along the specified dimension, the virtual shape is aligned with the representation of the object.

12. A non-transitory computer-readable medium comprising program instructions stored thereon that, when executed by at least one processor of a computing system, cause the computing system to perform functions comprising:
    presenting, via a visual interface, a virtual shape associated with a three-dimensional (3D) coordinate system;
    presenting, via the visual interface, a visual indicator positioned in proximity to the virtual shape and indicating that a specified spatial parameter of the virtual shape will be modified along a specified dimension of the 3D coordinate system in response to a given type of user input associated with the visual indicator;
    while presenting the visual indicator, detecting an instance of the given type of user input associated with the visual indicator; and
    after detecting the instance of the given type of user input, updating the virtual shape that is presented via the visual interface by modifying the specified spatial parameter of the virtual shape along the specified dimension,
    wherein the visual indicator comprises a first visual indicator and a second visual indicator, wherein the first visual indicator indicates a first direction along the specified dimension in which the specified spatial parameter of the virtual shape will be incremented in response to a first type of user input, and
    wherein the second visual indicator indicates a second direction along the specified dimension in which the specified spatial parameter of the virtual shape will be decremented in response to a second type of user input.

13. The non-transitory computer-readable medium of claim 12, further comprising program instructions stored thereon that, when executed by the at least one processor of the computing system, cause the computing system to perform functions comprising:
    before presenting the visual indicator, detecting a user selection of the specified spatial parameter and the specified dimension of the 3D coordinate system, wherein the detecting of the user selection responsively triggers the presenting of the visual indicator.

14. The non-transitory computer-readable medium of claim 12, wherein the visual indicator comprises the first visual indicator indicating that the specified spatial parameter of the virtual shape will be incremented along the specified dimension of the 3D coordinate system in response to receiving the first type of user input associated with the first visual indicator, and
    wherein the non-transitory computer-readable medium further comprises program instructions stored thereon that, when executed by the at least one processor of the computing system, cause the computing system to perform functions comprising:
    presenting, via the visual interface, the second visual indicator positioned in proximity to the virtual shape and indicating that the specified spatial parameter of the virtual shape will be decremented along the specified dimension of the 3D coordinate system in response to the second type of user input associated with the second visual indicator.

15. The non-transitory computer-readable medium of claim 14, further comprising program instructions stored thereon that, when executed by the at least one processor of the computing system, cause the computing system to perform functions comprising:
    after detecting the instance of the first type of user input and updating the virtual shape that is presented via the visual interface by incrementing the specified spatial parameter of the virtual shape along the specified dimension, detecting an instance of the second type of user input associated with the second visual indicator; and
    after detecting the instance of the second type of user input, updating the virtual shape that is presented via the visual interface by decrementing the specified spatial parameter of the virtual shape along the specified dimension.

16. A computing system comprising:
    at least one processor;
    a non-transitory computer-readable medium; and
    program instructions stored on the non-transitory computer-readable medium that are executable by the at least one processor such that the computing system is configured to:
    present, via a visual interface, a virtual shape associated with a three-dimensional (3D) coordinate system;
    present, via the visual interface, a visual indicator positioned in proximity to the virtual shape and indicating that a specified spatial parameter of the virtual shape will be modified along a specified dimension of the 3D coordinate system in response to a given type of user input associated with the visual indicator;
    while presenting the visual indicator, detect an instance of the given type of user input associated with the visual indicator; and
    after detecting the instance of the given type of user input, update the virtual shape that is presented via the visual interface by modifying the specified spatial parameter of the virtual shape along the specified dimension,
wherein the visual indicator comprises a first visual indicator and a second visual indicator, wherein the first visual indicator indicates a first direction along the specified dimension in which the specified spatial parameter of the virtual shape will be incremented in response to a first type of user input, and
wherein the second visual indicator indicates a second direction along the specified dimension in which the specified spatial parameter of the virtual shape will be decremented in response to a second type of user input.

17. The computing system of claim 16, wherein the visual indicator comprises a first visual indicator indicating that the specified spatial parameter of the virtual shape will be incremented along the specified dimension of the 3D coordinate system in response to receiving a first type of user input associated with the first visual indicator, and wherein the computing system further comprises program instructions stored on the non-transitory computer-readable medium that are executable by the at least one processor such that the computing system is configured to:

present, via the visual interface, a second visual indicator positioned in proximity to the virtual shape and indicating that the specified spatial parameter of the virtual shape will be decremented along the specified dimension of the 3D coordinate system in response to a second type of user input associated with the second visual indicator.

18. The computing system of claim 17, further comprising program instructions stored on the non-transitory computer-readable medium that are executable by the at least one processor such that the computing system is configured to:

after detecting the instance of the first type of user input and updating the virtual shape that is presented via the visual interface by incrementing the specified spatial parameter of the virtual shape along the specified dimension, detect an instance of the second type of user input associated with the second visual indicator; and after detecting the instance of the second type of user input, update the virtual shape that is presented via the visual interface by decrementing the specified spatial parameter of the virtual shape along the specified dimension.

* * * * *